United States Patent [19]
Horiguchi

[11] Patent Number: 5,734,174
[45] Date of Patent: Mar. 31, 1998

[54] PHOTO HOLE BURNING MEMORY

[75] Inventor: Naoto Horiguchi, Kawasaki, Japan

[73] Assignee: Fujitsu Limited, Kawasaki, Japan

[21] Appl. No.: 711,296

[22] Filed: Sep. 6, 1996

[30] Foreign Application Priority Data

Mar. 19, 1996 [JP] Japan .................... 8-062982

[51] Int. Cl.$^6$ .................... H01L 29/06
[52] U.S. Cl. .................... 257/17; 257/21; 257/25
[58] Field of Search .................... 257/17, 21, 22, 257/25

[56] References Cited

U.S. PATENT DOCUMENTS 5,663,571  9/1997  Ugajin .................... 257/17

*Primary Examiner*—Minh-Loan Tran
*Attorney, Agent, or Firm*—Armstrong, Westerman, Hattori, McLeland & Naughton

[57] ABSTRACT

A photo hole burning memory device includes a quantum dot and a quantum well layer cooperating with the quantum dot for storing information and a periodic structure that creates a photonic bandgap, wherein the periodic structure includes a local irregularity that forms a level in the photonic bandgap.

10 Claims, 36 Drawing Sheets

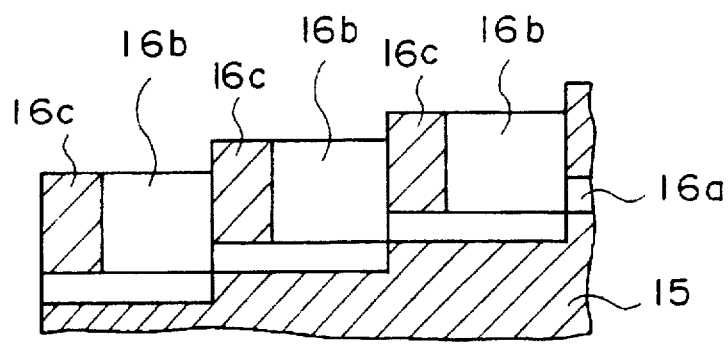
FID. 3D
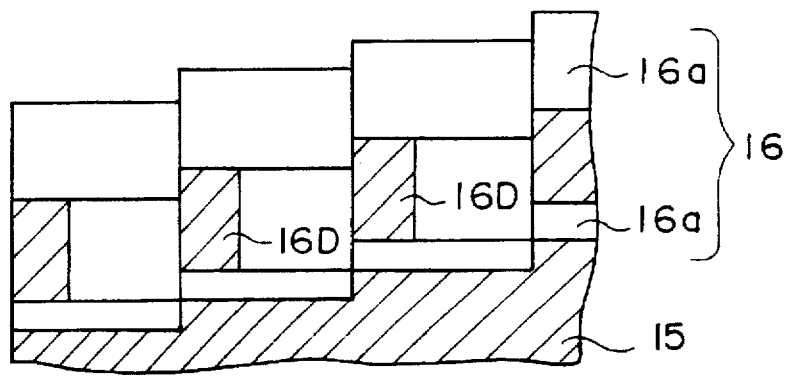
FIG. 3E

FIG. IIA
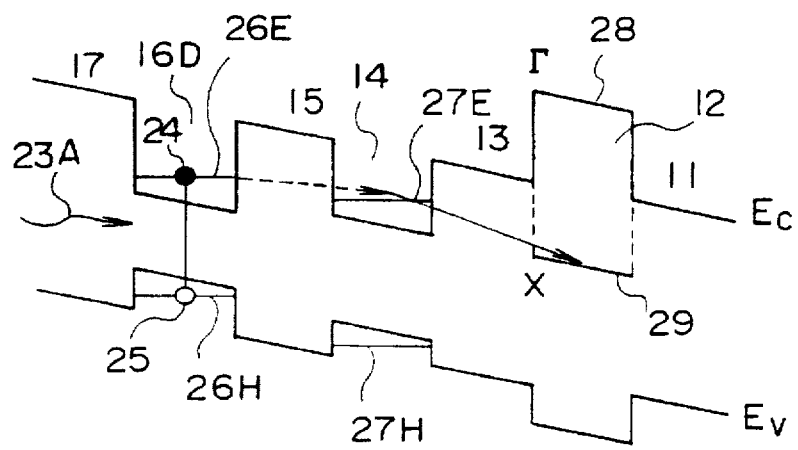
FIG. IIB
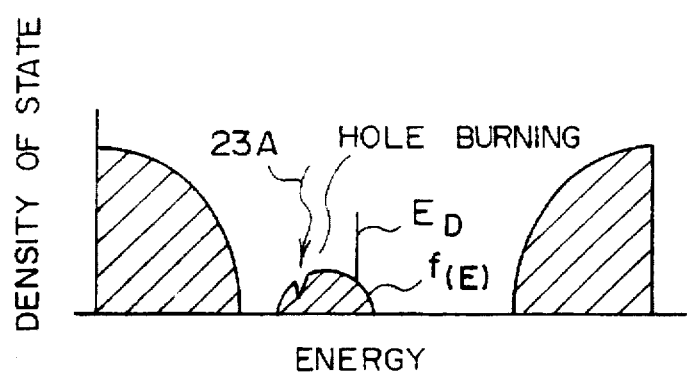

F I G. 32
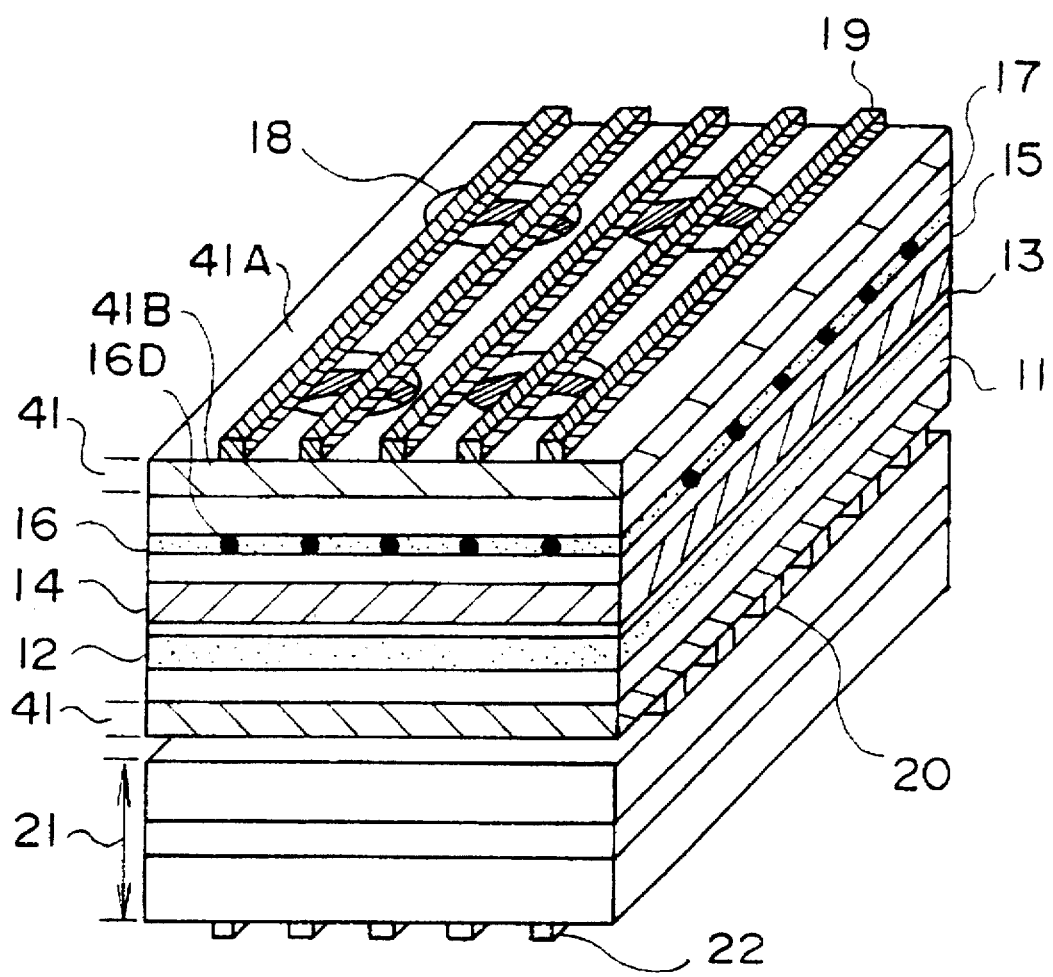

PHOTO HOLE BURNING MEMORY

BACKGROUND OF THE INVENTION

The present invention generally relates to optical semiconductor devices and more particularly to an optical semiconductor memory device called photo hole burning memory.

With wide spreading of information exchange and processing in every field of human society, there is an increasing demand for a high density memory device capable of storing very large amount of information in a solid and compact body.

In order to meet for such a demand, there is proposed an optical semiconductor memory device called photo hole burning memory that uses quantum dots for storing information.

FIGS. 1A and 1B show the principle of a conventional photo hole burning memory, wherein FIG. 1A shows the fundamental structure of the photo hole burning memory in an oblique view, while FIG. 1B shows the band structure of the photo hole burning memory.

Referring to FIG. 1A, the photo hole burning memory includes a barrier layer 1 of AlGaAs formed on a substrate not illustrated, wherein a quantum well layer 2 of AlAs is formed on the barrier layer 1, and another barrier layer 3 of AlGaAs is provided on the quantum well layer 2. Further, a quantum dot layer 4 is provided on the barrier layer 3, and a number of quantum dots 4D are formed in the quantum dot layer 4. A still further barrier layer 5 of AlGaAs is provided on the quantum dot layer 4. After the formation of the layers 1–5, the substrate is removed by an etching process.

In operation, an optical beam 6 is directed to the device as indicated in FIG. 1A, wherein reading and writing of information is made by causing an excitation of carriers in the quantum dots 4D as will be explained in detail below with reference to FIG. 1B.

Referring to the band diagram of FIG. 1B showing a conduction band Ec and a valence band Ev as usual, it will be noted that the quantum dot 4D includes a quantum level 9E for electrons and a quantum level 9H for holes formed as a result of a spatial confinement of the carriers in the quantum dot 4D that has a size substantially smaller than the de Broglie wavelength of the carriers.

Further, in FIG. 1B, it will be noted that the quantum well layer 2 has a composition that forms a type-II quantum well together with the barrier layers 1 and 3, in which it will be noted that the Γ valley has a higher energy level as compared with the X valley as usual in a type II quantum well, and the X-valley of the quantum well layer 2 forms a quantum well with respect to the adjacent barrier layers 1 and 3.

On the other hand, in the quantum dot 4D, a so-called type-I quantum well is formed in which the energy level of the Γ valley is lower than the energy level of the X valley and in which the energy level of the Γ valley of the quantum dot 4D is lower than energy level of the Γ valley as well as the X valley of the adjacent barrier layers 3 and 5. Thereby, a three-dimensional carrier confinement characterizing a quantum dot is realized in the Γ valley of the quantum dot 4D.

In the band diagram of FIG. 1B, the Γ valley of the quantum well layer 2 forms a predominant potential barrier with respect to the adjacent barrier layers 1 and 3, while in the layer 2 of AlAs, which causes an indirect-transition of carriers under the presence of phonons, the X valley provides an effective potential well as noted already.

When writing information in the photo hole burning memory of FIGS. 1A and 1B, an optical beam having an energy corresponding to the energy between the quantum level 9E and the quantum level 9H is directed to the quantum dot layer 4 as the optical beam 6 such that an electron-hole pair, which is formed of an electron 7 and a hole 8, is excited in a quantum dot 4D having an energy matching the energy of the optical beam.

The electron 7 thus excited passes through the barrier layer 3 of AlGaAs by a tunneling effect in the unbiased state of the device, and the electron 7 thus tunneled falls into the quantum well 11 provided by the X valley of AlGaAs in the quantum well layer 2 as indicated by a broken line, leaving the hole 8 in the quantum dot 4D. Thus, the structure of FIGS. 1A and 1B is capable of separating the excited electrons and holes spatially, and the recombination of the electron 7 and the hole 8, which leads to the loss of information, is prevented.

When reading the written information, an optical beam having an energy identical to the optical beam 6 is directed to the quantum dot layer 4. When the quantum dot 4D has already experienced optical excitation, the quantum dot 4D can no longer absorb the optical beam 6, and the optical beam 6 passes through the quantum dot layer 4 as well as the quantum well layer 2. On the other hand, when the quantum dot 4D has not experienced optical excitation, an absorption occurs in the quantum dot 4D. Thereby, the optical beam is interrupted.

So far, the retention of information achieved in the foregoing photo hole burning memory is in the order of nanoseconds. Obviously, this retention time is totally insufficient for a practical memory device.

Further, the conventional hole burning memory has a drawback in that the optical irradiation at the time of reading of the information causes an excitation of an electron-hole pair in a quantum dot not experienced an optical excitation, while the electron thus excited may cause a tunneling to an adjacent quantum dot layer 4. Thus, there is a substantial risk that the information is unwantedly erased after repeated reading of the information as a result of the recombination of the electron returned to the quantum dot 4D and the hole remaining in the quantum dot 4D.

Further, in the conventional device noted above, it is necessary to wait, when erasing the information, until the electron that has once caused a tunneling to the quantum well layer 2 at the time of writing, to cause a tunneling back to the quantum dot 4D. The electron thus returned to the quantum dot 4D is then annihilated by causing a recombination with the hole, while such a process may take some time.

Further, the conventional device is not suitable to a very high density recording of information, as the recording density of information is determined by the size of the optical beam used for writing.

SUMMARY OF THE INVENTION

Accordingly, it is a general object of the present invention to provide a novel and useful photo hole burning memory device wherein the foregoing problems are eliminated.

Another and more specific object of the present invention is to provide a photo hole burning memory device having a long retention time of information.

Another object of the present invention is to provide a photo hole burning memory device that enables repeated reading of information without destroying the information while holding information stably for a prolonged duration.

Another object of the present invention is to provide a photo hole burning memory device that enables a high speed erasing of information.

Another object of the present invention is to provide a photo hole burning memory device providing a large recording density.

Another object of the present invention is to provide a photo hole burning memory device comprising:
a quantum dot layer including a plurality of quantum dots each forming a quantum level in said quantum layer, each of said quantum dots absorbing an optical radiation having an energy corresponding to said quantum level and creating an electron-hole pair in response thereto;
a periodic structure provided in said quantum dot layer for creating a photonic bandgap including therein an absorption energy of said quantum dot;
an information retention layer provided adjacent to said quantum dot layer, said information retention layer including a quantum well having a quantum level lower than said quantum level of said quantum dots;
a tunneling barrier layer interposed between said quantum dot layer and said information retention layer, said tunneling barrier layer forming a potential barrier, said tunneling barrier layer having a thickness that allows a passage of electrons therethrough by tunneling; and
a biasing electrode structure for applying a biasing electric field to said quantum dot layer and said information retention layer.

Another object of the present invention is to provide a method for writing information in a photo hole burning memory device, said photo hole burning memory device comprising: a quantum dot layer including a plurality of quantum dots each forming a quantum level in said quantum layer, each of said quantum dots absorbing an optical radiation having an energy corresponding to said quantum level and creating an electron-hole pair in response thereto; a periodic structure provided in said quantum dot layer for creating a photonic bandgap including therein an absorption energy of said quantum dot; an irregular structure formed in said periodic structure, said irregular structure forming a photonic doping level within said photonic bandgap; an information retention layer provided adjacent to said quantum dot layer, said information retention layer including a quantum well having a quantum level lower than said quantum level of said quantum dots; a tunneling barrier layer interposed between said quantum dot layer and said information retention layer, said tunneling barrier layer forming a potential barrier, said tunneling barrier layer having a thickness that allows a passage of electrons therethrough by tunneling; and a biasing electrode structure for applying a biasing electric field to said quantum dot layer and said information retention layer, said method comprising the steps of:
applying a bias to said biasing electrode such that a selected quantum dot included in said plurality of quantum dots has an energy coincident to said photonic doping level;
irradiating said quantum dots with an optical beam having an energy coincident to said photonic doping level, said optical beam interacting with said periodic structure, such that an excitation of an electron-hole pair occurs in said selected quantum dot; and
eliminating said bias such that said energy of said plurality of quantum dots shifts away from said energy of said photonic doping level.

Another object of the present invention is to provide a method for reading information from a photo hole burning device, said photo hole burning memory device comprising:
a quantum dot layer including a plurality of quantum dots each forming a quantum level in said quantum layer, each of said quantum dots absorbing an optical radiation having an energy corresponding to said quantum level and creating an electron-hole pair in response thereto; a periodic structure provided in said quantum dot layer for creating a photonic bandgap including therein an absorption energy of said quantum dot; an irregular structure formed in said periodic structure, said irregular structure forming a photonic doping level within said photonic bandgap; an information retention layer provided adjacent to said quantum dot layer, said information retention layer including a quantum well having a quantum level lower than said quantum level of said quantum dots; a tunneling barrier layer interposed between said quantum dot layer and said information retention layer, said tunneling barrier layer forming a potential barrier, said tunneling barrier layer having a thickness that allows a passage of electrons therethrough by tunneling; and a biasing electrode structure for applying a biasing electric field to said quantum dot layer and said information retention layer, said method comprising the steps of:
applying a bias to said biasing electrode such that a selected quantum dot included in said plurality of quantum dots has an energy coincident to said photonic doping level;
applying an optical beam having an energy coincident to said photonic doping level; and
detecting a passage of said optical beam through said selected quantum dot.

Another object of the present invention is to provide a method for erasing information in a photo hole burning device, said photo hole burning memory device comprising:
a quantum dot layer including a plurality of quantum dots each forming a quantum level in said quantum layer, each of said quantum dots absorbing an optical radiation having an energy corresponding to said quantum level and creating an electron-hole pair in response thereto; a periodic structure provided in said quantum dot layer for creating a photonic bandgap including therein an absorption energy of said quantum dot; an irregular structure formed in said periodic structure, said irregular structure forming a photonic doping level within said photonic bandgap; an information retention layer provided adjacent to said quantum dot layer, said information retention layer including a quantum well having a quantum level lower than said quantum level of said quantum dots; a tunneling barrier layer interposed between said quantum dot layer and said information retention layer, said tunneling barrier layer forming a potential barrier, said tunneling barrier layer having a thickness that allows a passage of electrons therethrough by tunneling; and a biasing electrode structure for applying a biasing electric field to said quantum dot layer and said information retention layer, said method comprising the steps of:
applying a bias to said biasing electrode such that an electron held in said information retention layer returns to a selected quantum dot, said bias being adjusted such that said selected quantum dot has an energy coincident to said photonic dopant level.

According to the present invention, the photonic bandgap formed by the periodic structure excludes, from the periodic structure, a radiation having an energy falling in the photonic bandgap except for a radiation having a predetermined energy that causes a resonance with a "photonic dopant level," wherein the photonic dopant level is formed in the photonic bandgap by providing an irregularity intentionally to the periodic structure. The irregularity thereby acts similarly to a deep dopant in the usual band structure of a semiconductor crystal. It should be noted that a deep dopant creates a deep dopant level in the bandgap of a semiconductor crystal, while an irregularity formed in the periodic structure creases a similar photonic dopant level in the photonic bandgap.

Thus, by suitably biasing the memory device such that the quantum level of the quantum dot matches the photonic dopant level, it is possible to cause an optical excitation of the quantum dot selectively by the optical beam that causes a resonance with the photonic dopant level. It should be noted that the optical radiation having an energy offset or de-tuned from the photonic dopant level is expelled from the periodic structure and cannot penetrate into the interior of the memory device where the quantum dots are formed.

After such a writing of information, the quantum dot is de-tuned with respect to the photonic dopant level by changing the bias. Thereby, no optical radiation penetrates into the memory device anymore with the energy that causes interaction with the quantum dot, and the information is held stably in the memory device. Even when the excited electron has returned accidentally to the quantum dot, the recombination of the electron and hole is prohibited due to the absence of the state for the photon that is released as a result of the recombination. In the periodic structure, it should be noted that only the optical radiation having an energy that matches the photonic dopant level can exist.

Other objects and further features of the present invention will become apparent from the following detailed description when read in conjunction with the attached drawings.

BRIEF DESCRIPTION OF THE DRAWINGS

FIGS. 3A–3E are diagrams showing the process of forming a quantum dot in the structure of FIG. 2;

FIGS. 11A and 11B are respectively a band diagram and a photonic band diagram showing a writing of information under a biasing according to the second write mode operation of the photo hole burning memory of FIG. 2;

FIG. 32 is a diagram showing the construction of a photo hole burning memory according to a third embodiment of the present invention;

DETAILED DESCRIPTION OF THE PREFERRED EMBODIMENTS

[FIRST EMBODIMENT]

Figure 2:
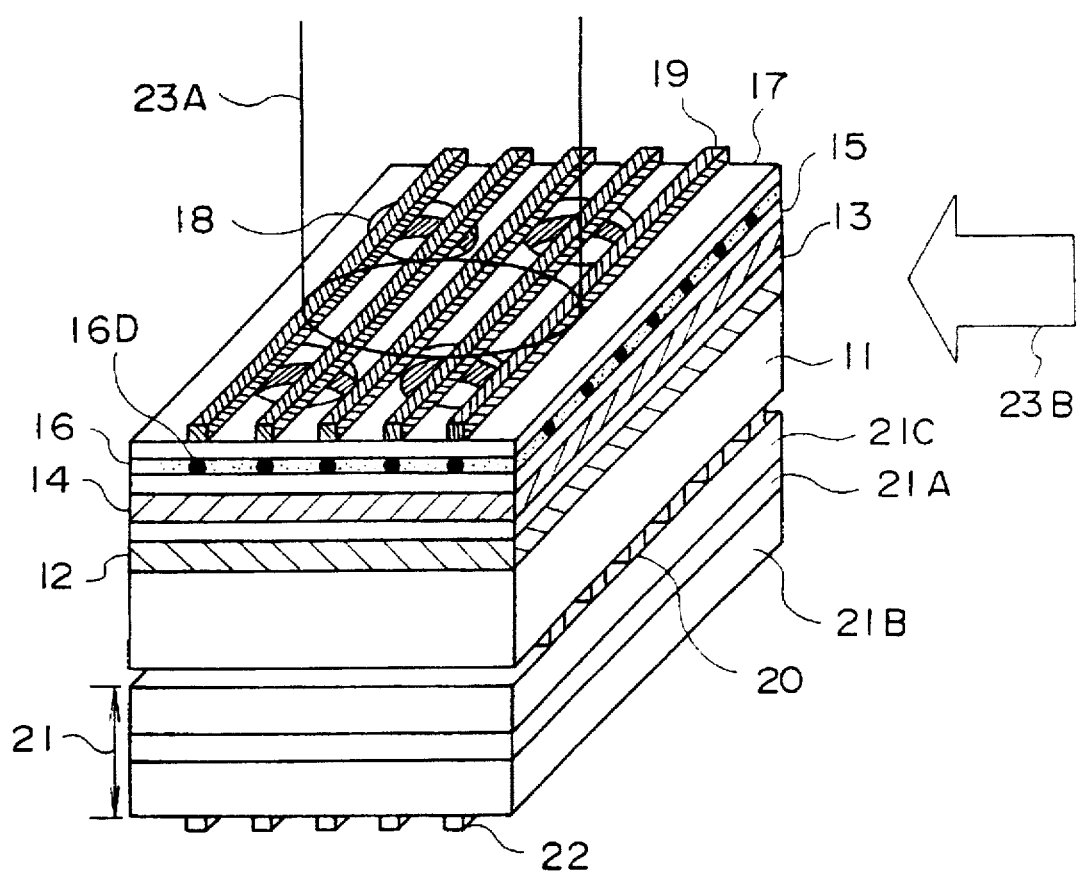
FIG. 2 is a diagram showing the construction of a photo hole burning memory according to a first embodiment of the present invention.

FIG. 2 shows the construction of a photo hole burning memory according to a first embodiment of the present invention.

Figure 1A:
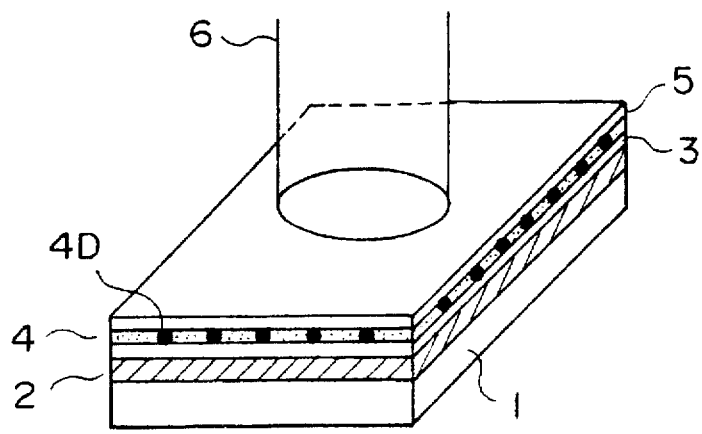
FIGS. 1A and 1B are diagrams showing a conventional photo hole burning memory.

Referring to FIG. 2, the photo hole burning memory includes a barrier layer 11 of AlGaAs having a composition of $Al_{0.5}Ga_{0.5}As$ and a thickness of 386 nm corresponding to the barrier layer 1 of FIG. 1A, a type II quantum well layer 12 of AlAs provided on the barrier layer 11 in correspondence to the quantum well layer 2 with a thickness of 7 nm, a barrier layer 13 of AlGaAs provided on the quantum well layer 12 with a composition of $Al_{0.5}Ga_{0.5}As$ and a thickness of 3 nm in correspondence to the barrier layer 3, a type I quantum well layer 14 of AlGaAs provided on the barrier layer 13 with a composition of $Al_{0.3}Ga_{0.7}As$ and a thickness of 5 nm, a barrier layer 15 of AlGaAs provided on the quantum well layer 14 with a composition of $Al_{0.5}Ga_{0.5}As$ and a thickness of 3 nm in correspondence to the barrier layer 3 of FIG. 1A, and a quantum dot layer 16 of AlGaAs provided on the barrier layer 15 with a composition of $Al_{0.5}Ga_{0.5}As$ with a thickness 10 nm in correspondence to the quantum dot layer 4, wherein quantum dots 16D of GaAs each having a size of about 10 nm are embedded in the quantum dot layer 16 with a mutual separation of about 10 nm similarly to the quantum dots 4D. Further, another barrier layer 17 of AlGaAs corresponding to the barrier layer 5 is provided on the quantum dot layer 16 with a composition of $Al_{0.5}Ga_{0.5}As$ and a thickness of 386 nm.

The formation of the layers 12–17 may be achieved by a conventional MBE or MOCVD process conducted on a GaAs substrate (not shown) having an inclined (110)-oriented surface as will be described later with reference to the formation of the quantum dots, wherein the GaAs substrate is removed selectively by a wet etching process after the formation of the layers 12–17.

In the layered structure thus formed, a number of apertures 18 are formed perpendicularly to the layers with a diameter of 0.6 μm and a regular pitch of 0.8 μm such that each aperture 18 penetrates at least through the layers 16 and 17, preferably by an RIE (reactive ion etching) process using a resist mask.

Further, electrodes 19 and 20 each having a thickness of 100 nm and a width of 100 nm are provided respectively on the barrier layer 17 and the barrier layer 20, wherein the upper electrodes 19 extend parallel with each other on the upper major surface of the barrier layer 17 in a first direction while the lower electrodes 20 extend parallel with each other on the lower major surface of the barrier layer 11 in a second direction perpendicularly to the first direction.

It should be noted that the upper electrodes 19 include a part bridging over an aperture 18, wherein the electrodes having such an air bridge structure are formed by filling the apertures 18 by a photoresist, followed by a deposition and patterning of a layer of $InSnO_3$, which is a transparent conductor. After the formation of the electrodes 19 as a result of the patterning, the photoresist filling the apertures 18 are dissolved. The lower electrodes 20 are formed similarly, by depositing and patterning an $InSnO_3$ layer.

Further, a photodetector 21 of known p-i-n construction is disposed below the foregoing layered structure for detecting an optical beam 23A passed through the layered structure when reading the memory. As usual, the photodetector 21 includes an undoped GaAs layer 21A sandwiched by a p-type GaAs layer 21B below and an n-type GaAs layer 21C above, and electrodes 22 are provided on the lower major surface of the GaAs layer 21C so as to extend parallel with each other in the foregoing first direction. It should be noted that the electrodes 20 intervene between the barrier layer 11 and the GaAs layer 21C and are shared by the layer 11 and the layer 21C.

FIGS. 3A–3E show a representative process for forming the quantum dot layer 16.

Figure 3A:
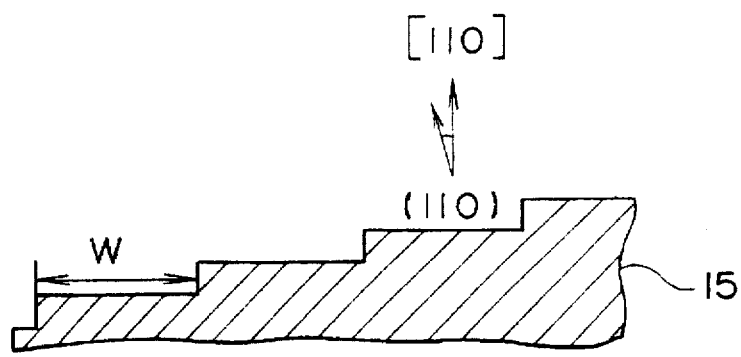

Referring to FIG. 3A showing the upper major surface of the barrier layer 15 before the formation of the quantum dot layer 16, it will be noted that the upper major surface of the barrier layer 15 includes a number of steps each forming an (110) surface and a size W as a result of use of an inclined GaAs substrate as noted before. More specifically, in correspondence to the formation of inclination on the (110) surface of the GaAs substrate in a <$\bar{1}1\bar{1}$> direction with an inclination angle of about 1.2°, for example, a corresponding stepped surface appears on the upper major surface of the barrier layer 15. Each of the steps thus formed has an (110) orientation as noted already and has a rectangular shape in a plan view, the rectangular step surface being defined by a pair of mutually intersecting step edges at an ascending side of the stepped upper major surface and another pair of mutually intersecting step edges at a descending side.

Figure 3B:
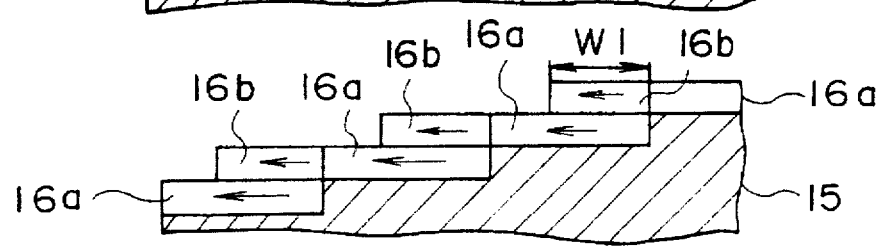

Next, in the step of FIG. 3B, a lateral growth of an AlGaAs layer 16a having a composition of $Al_{0.5}Ga_{0.5}As$ and forming a part of the layer 16 is conducted, starting from the ascending side step edges, wherein the lateral growth occurs two dimensionally from the respective step edges. The lateral growth is continued further when the layer 16a has reached the descending side step edges, and a layer 16b of $Al_{0.5}Ga_{0.5}As$ is grown as indicated in FIG. 3B, wherein the lateral growth of the layer 16b is interrupted when the layer 16b has reached a size $W_1$.

Figure 3C:
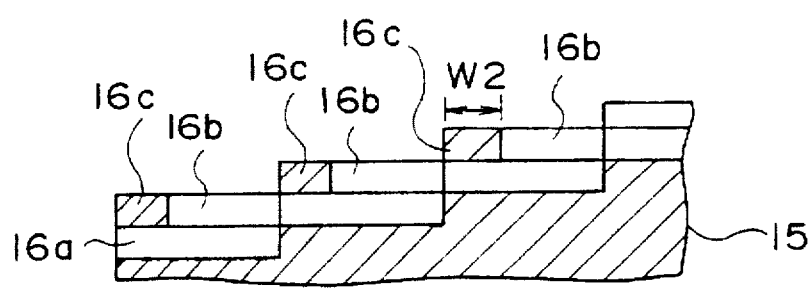

Next, in the step of FIG. 3C, a lateral growth of GaAs is started from the edge of the layer 16b to form a GaAs layer 16c, until the layer 16c reaches the descending side step edge. Thereby, the layer 16c has a lateral size of $W_2$.

By repeating the steps of FIGS. 3B and 3C, a structure shown in FIG. 3D is obtained in which the GaAs layer 16c is laterally confined by the AlGaAs layer 16b. Further, by providing the AlGaAs layer 16a also on the top of the structure of FIG. 3D, the layer 16 is formed as indicated in FIG. 3E, wherein each of the GaAs layers 16c is laterally and vertically confined by AlGaAs and forms a quantum dot 16D. It should be noted that the lateral growth of the AlGaAs layers 16a and 16b occurs two dimensionally as noted before, and thus, the GaAs layer 16c and hence the quantum dot 16D is confined three-dimensionally by AlGaAs in the structure of FIG. 3E.

Each of the quantum dots 16D thus formed has a fluctuation in the size and thus, there appears a natural distribution of energy in the quantum dots 16D. Such a distribution of energy of the quantum dots 16D is used in a wavelength multiplex recording as will be explained below. Further, one may repeat the structure of FIG. 3E vertically in the quantum dot layer 16. In this case, it is possible to induce a distribution of energy in the quantum dots intentionally by changing the vertical size or thickness of the quantum dots 16D in each of the repetitions.

Further, the formation of the quantum dot 16D is not limited to the process of FIGS. 3A–3E but other processes such as the one that uses an island growth in a strained heteroepitaxial system may be employed.

Figure 1B:
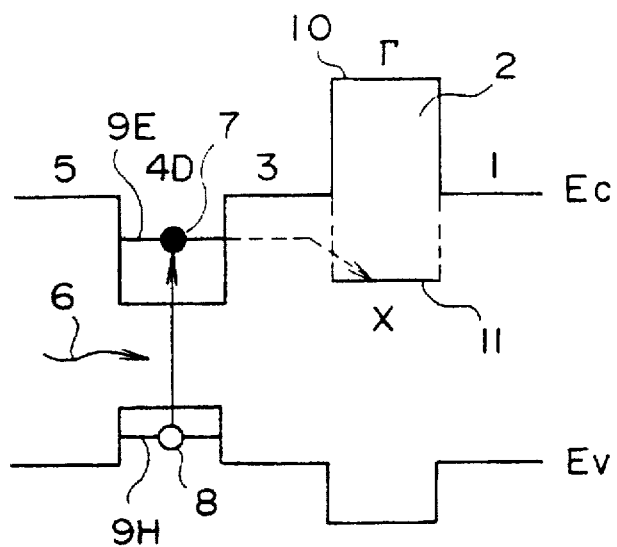

Hereinafter, the operation of the photo hole burning memory of FIG. 1 will be explained.

In brief, the photo hole burning memory increases the retention time of information by providing a periodic structure formed by the apertures 18. The retention time of the information is increased further by providing the type I quantum well layer 14 in addition to the type II quantum well layer 12 such that the type I quantum well layer 14 is located between the quantum dot layer 16 and the quantum well layer 12. The quantum dots 16D act identically to the quantum dots 4D explained with reference to FIG. 1B. The reading of information is achieved by the photodetector 21 that detects the passage of the optical beam 23A directed to the barrier layer 17 and further into the quantum dot layer 16 vertically from an upward direction.

Hereinafter, the concept of "photonic bandgap" that plays an essential role in the present invention will be explained.

In the photo hole burning memory of FIG. 2, a periodic structure is formed in the quantum dot layer 16 by forming the apertures 18 as already noted, wherein such a periodic structure creates a forbidden band or bandgap of photons in the energy spectrum of an optical beam that interacts with the periodic structure, similarly to the case of electrons in a crystal structure. The bandgap thus formed in the optical energy is called photonic bandgap.

Further, in the periodic structure that forms such a photonic bandgap, it is possible to introduce a level of photons within the photonic bandgap by intentionally disturbing the periodic structure. For example, one or more apertures 18 may be closed in the periodic structure of FIG. 2. The level formed in the photonic bandgap is somewhat similar to the deep impurity level formed in the bandgap of a semiconductor crystal by doping a deep impurity and is called hereinafter as "photonic dopant level." Further, the formation of a local irregularity in the periodic structure is called hereinafter as "photonic doping." By introducing a photonic dopant level in the photonic bandgap, it is possible to allow an optical radiation to exist in the periodic structure selectively at an energy coincident to the photonic dopant level, while the radiation having an energy offset from the photonic dopant level is expelled from the periodic structure and cannot penetrate thereinto.

Figure 4A:
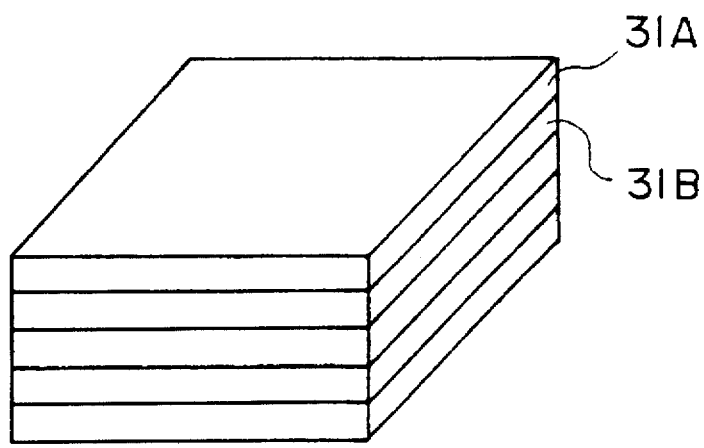
FIGS. 4A–4C are diagrams showing various periodic structures that can be used in the photo hole burning memory of FIG. 2 for creating a photonic bandgap.
Figure 4B:
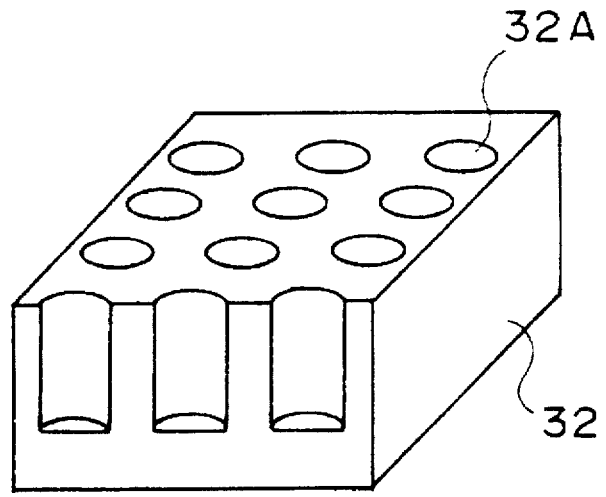
Figure 4C:
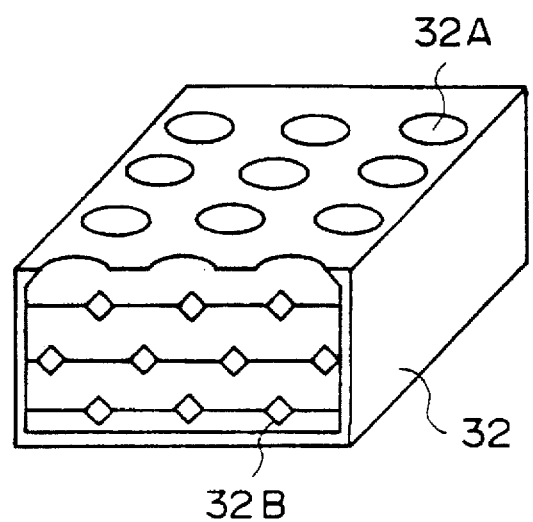

FIGS. 4A–4C show various examples of the periodic structure that can be used in the photo hole burning memory of FIG. 2, wherein FIG. 4A shows a one-dimensional periodic structure formed by a periodical and alternate stacking of semiconductor layers 31A and 31B, while FIG. 4B shows a two-dimensional periodic structure provided by apertures 32A formed in a semiconductor layer 32 with a regular pitch similarly to the apertures 18 of FIG. 2. On the other hand, FIG. 4C shows an example of a three-dimensional periodic structure in which horizontal holes 32B are formed in the semiconductor layer 32 of FIG. 4B in addition to the vertical apertures 32A. The structure of FIG. 4C may be formed by bonding a number of layers each formed with grooves to form a stack and by forming the apertures 32A vertically to the layers.

Further, a three-dimensional periodic structure can be formed easily by combining the one-dimensional structure of FIG. 4A with the two-dimensional structure of FIG. 4B. It should be noted that the one-dimensional structure of FIG. 4A can be formed easily by an epitaxial process such as an MBE or MOCVD process.

Figure 5:
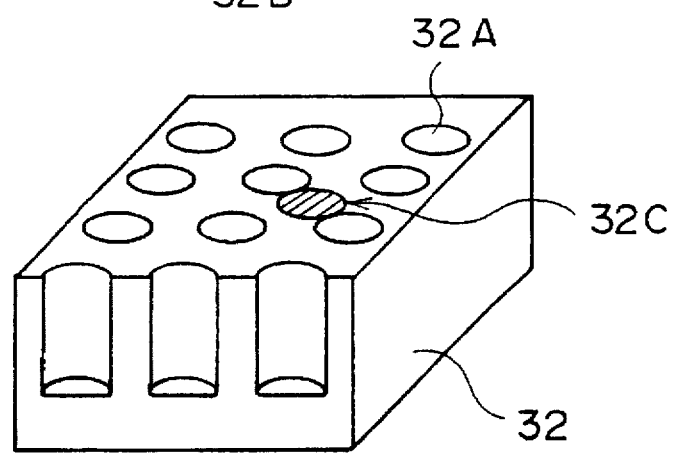
FIG. 5 is a diagram showing an example of photonic doping used in the photo hole burning memory of FIG. 2.

FIG. 5 shows an example of the photonic doping in which an extra aperture 32C is formed in the periodic structure of FIG. 4B so as to disturb the regularity of the structure locally. Alternatively, one may achieve a similar photonic doping by closing one or more of the apertures 32A.

In the foregoing one-dimensional and two-dimensional periodic structure, it should be noted that the photonic bandgap appears only in the optical beam that crosses the periodic structure. The photonic bandgap does not appear for the optical beam that does not cross the periodic structure. For example, the photonic bandgap does not appear in the optical beam that impinges vertically to the semiconductor layer 32 in the structure of FIG. 4B. Similarly, the photonic bandgap does not appear in the optical beam that impinges laterally to the layered structure of FIG. 4A.

WRITE MODE OPERATION

Hereinafter, writing of information will be explained for the photo hole burning memory of FIG. 2. In a write mode operation, an optical beam 23B used for writing is directed to the photo hole burning memory of FIG. 2 from a lateral direction as indicated by an arrow.

Figure 6A:
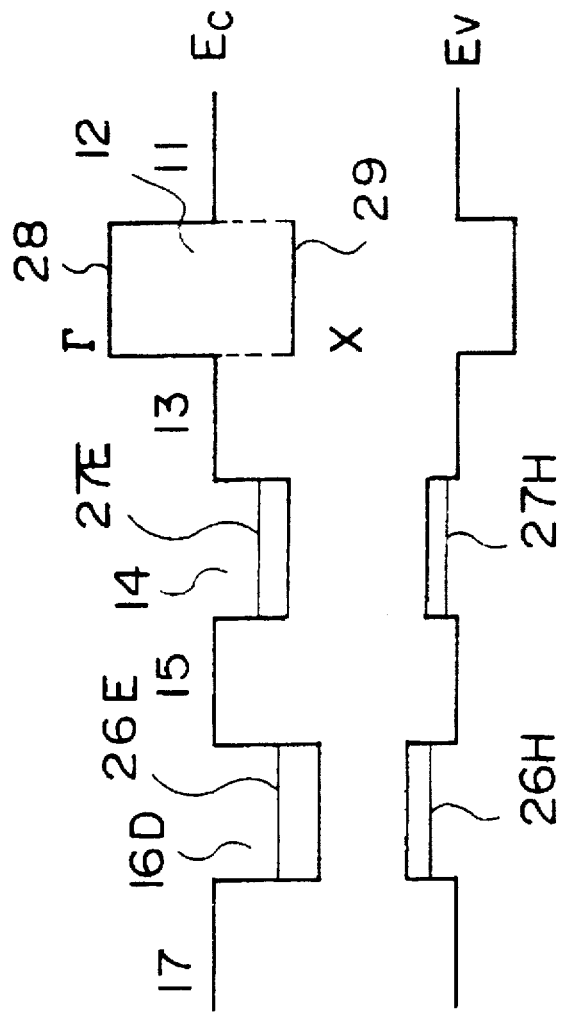
FIGS. 6A and 6B are respectively a band diagram and a photonic band diagram showing a state before a first write mode operation of the photo hole burning memory of FIG. 2.
Figure 6B:
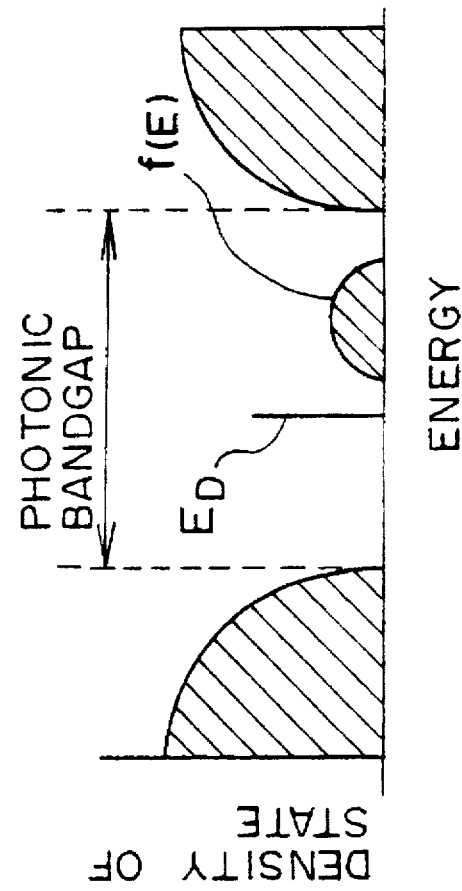

FIGS. 6A and 6B describe respectively the band structure and the photonic band structure of the photo hole burning memory of FIG. 2 in a thermal equilibrium state before the write mode operation is started, wherein the band designated by Γ represents a Γ valley 28 while the band designated by X represents an X valley 29 of the conduction band Ec in the quantum well layer 12.

Referring to FIG. 6A, it will be noted that the quantum dot 16D has a size smaller than the de Broglie wavelength of carriers, and a quantum level 26E and a quantum level 26H are formed in the quantum dot 16D respectively for electrons and holes as a result of a three-dimensional confinement of the carriers in the quantum dot 16D. Further, quantum levels 27E and 27H are formed in the type I quantum well layer 14 respectively for electrons and holes. In the state of FIG. 6A before the writing of information, the quantum dot layer 16, the quantum well layer 14 and the quantum well layer 12 are all free from carriers.

The photonic band diagram of FIG. 6B, on the other hand, represents the density of state of photons in the periodic structure of FIG. 2. Referring to FIG. 6B, it will be noted that there is no allowed state of photons in the photonic bandgap except for those having an energy coincident to the photonic dopant level designated by $E_D$.

Further, FIG. 6B shows the distribution profile f(E) of the state of the quantum dots 16D, wherein it should be noted that the distribution profile f(E) includes the contribution from various quantum dots 16D having respective resonant energies different from each other. The energy E of the quantum dots 16D in FIG. 6B corresponds to the difference between the quantum level 26E and the quantum level 26H, while it will be noted that the energy of the electrons is offset from the photonic dopant level in the unbiased, thermal equilibrium state of the photo hole burning memory.

Figure 7A:
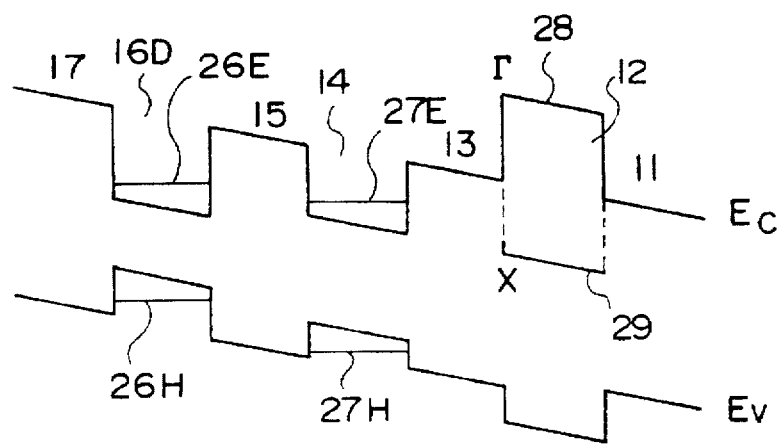
FIGS. 7A and 7B are respectively a band diagram and a photonic band diagram showing a biasing used in the first write mode operation of the photo hole burning memory of FIG. 2.
Figure 7B:
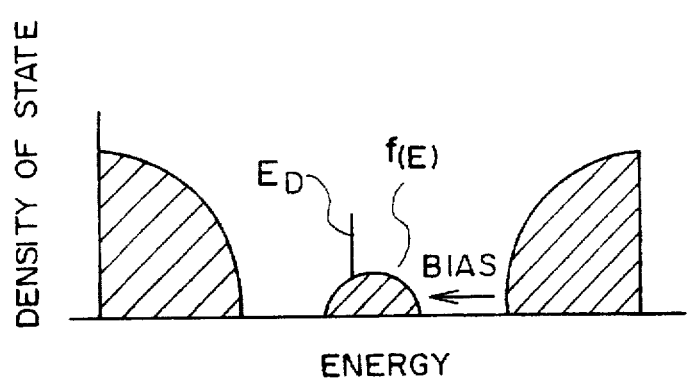

In the write mode operation, the photo hole burning memory of FIG. 2 is applied with a write bias as indicated in FIG. 7A by applying a bias voltage across a selected upper electrode 19 and a selected lower electrode 20, such that energy of the quantum dot 16D is raised with respect to the energy of the quantum layer 12. In response to the biasing, the energy distribution profile f(E) of the quantum dots 16D shifts with respect to the photonic dopant level $E_D$ as indicated in FIG. 7B by an arrow, wherein the magnitude of biasing is set such that the photonic dopant level $E_D$ overlaps the energy distribution profile f(E) of the quantum dots 16D.

Figure 8A:
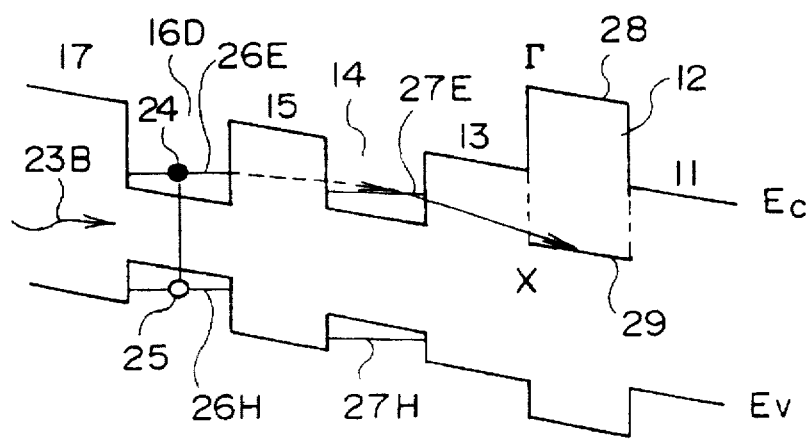
FIGS. 8A and 8B are respectively a band diagram and a photonic band diagram showing a writing of information according to the first write mode operation of the photo hole burning memory of FIG. 2.
Figure 8B:
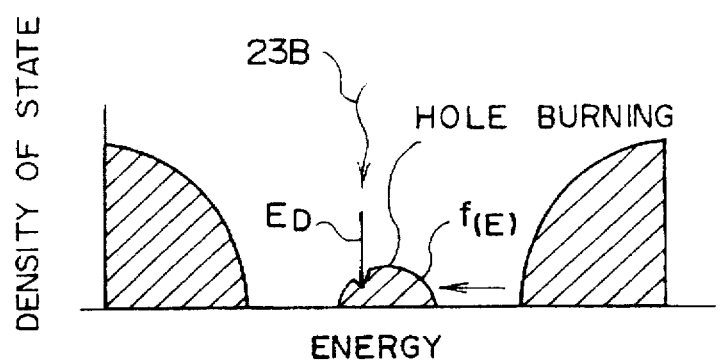

Next, in the state of FIGS. 8A and 8B, the write optical beam 23B is turned on with a wavelength tuned to the foregoing photonic dopant level $E_D$ as indicated in the photonic band diagram of FIG. 8B. In response to this, an electron 24 and a hole 25 are excited in the quantum dot 16D respectively to the quantum level 26E and the quantum level 26H as indicated in the band diagram of FIG. 8A, wherein the electron 24 thus excited cause, under the existence of the biasing electric field, a tunneling through the barrier layer 15 and further through the barrier layer 13 to the X valley 29 of the quantum well layer 28, after passing through the quantum well layer 14.

As a result of such a writing of the information, there is formed a hole burning dip in the state distribution f(E) of the quantum dots 16D at the energy of the quantum dot in which the writing of the information is made. Once the hole burning dip is formed, there is no available state of carriers for that quantum dot 16D, and no further excitation of the carriers occurs in the quantum dot.

Figure 9A:
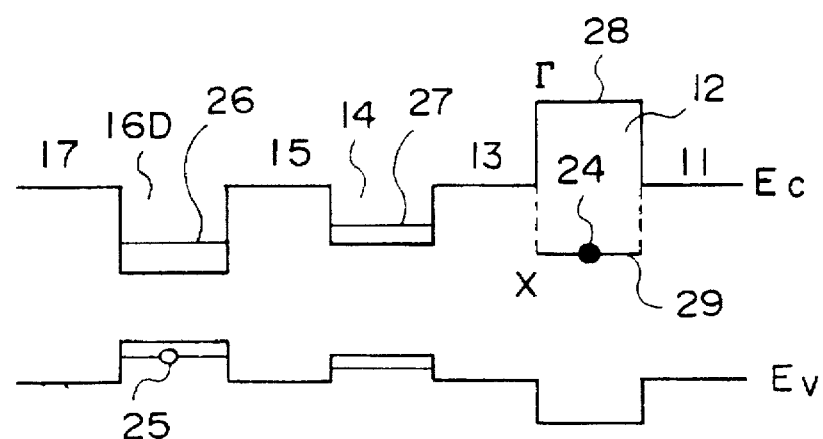
FIGS. 9A and 9B are respectively a band diagram and a photonic band diagram showing a state after the first write mode operation of the photo hole burning memory of FIG. 2.
Figure 9B:
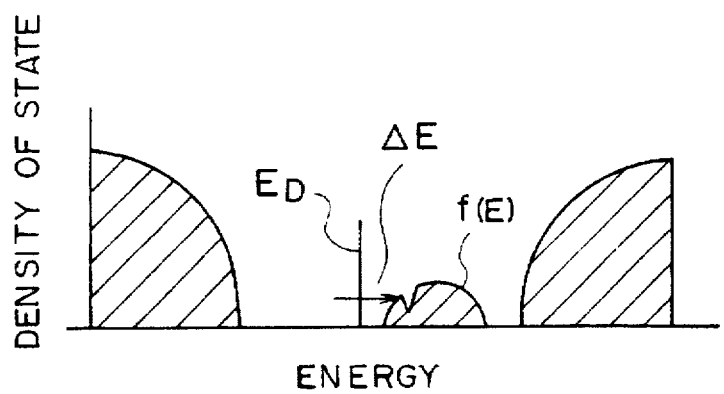

After the electron 24 is thus transported to the quantum well layer 12, the biasing is eliminated as represented in FIGS. 9A and 9B. As a result of the elimination of the biasing, it will be noted that the energy distribution f(E) of the quantum dot 16D is offset again with respect to the photonic dopant level $E_D$ by ΔE as represented in FIG. 9B. Thereby, the optical radiation that may cause an interaction with the quantum dots 16D cannot exist in the periodic structure of FIG. 1, and the chance of loss of the information as a result of the electron 24, returned accidentally to the quantum dot 16D from the quantum well 12, to cause a recombination with the hole 25, is substantially reduced as will be explained later in detail.

Further, the probability of transport of the electron 24, now held in the quantum well 12, back to the quantum dot 16D is reduced substantially due to the increased separation between the quantum dot layer 16 and the quantum well layer 12 and due to the existence of the intervening quantum well layer 14. Thereby, the photo hole burning memory of the present embodiment holds the written information stably for a prolonged duration. FIGS. 9A and 9B thereby represents a data hold mode.

It should be noted that writing of information into the photo hole burning memory of FIG. 1 can be achieved in a different manner.

Figure 10A:
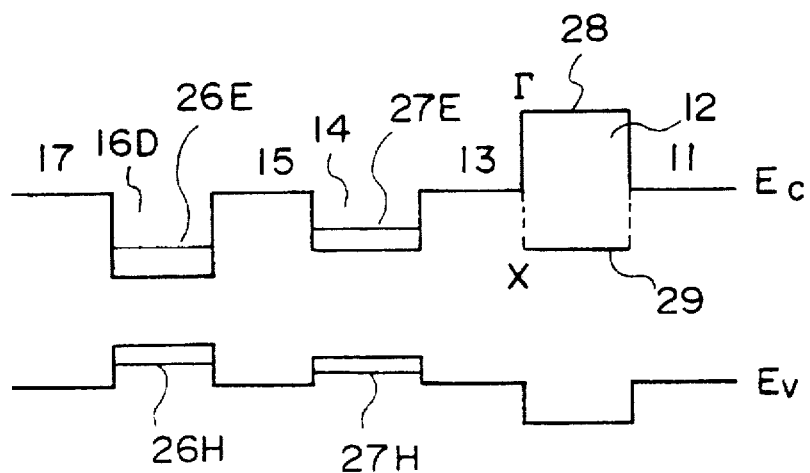
FIGS. 10A and 10B are respectively a band diagram and a photonic band diagram showing a state before a second, alternative write mode operation of the photo hole burning memory of FIG. 2.
Figure 10B:
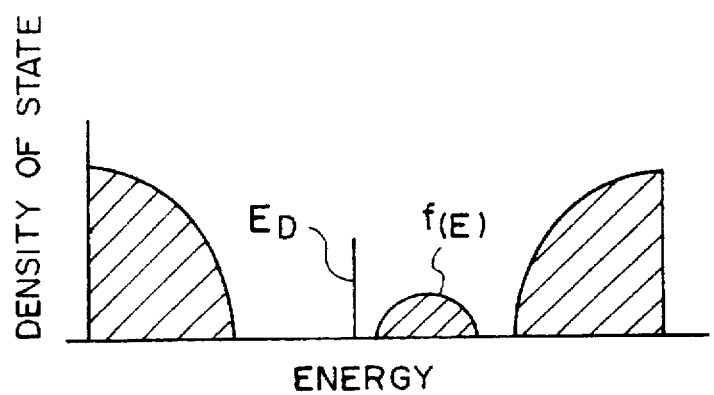

This alternative writing mode starts with the state of FIGS. 10A and 10B that is identical to the state of FIGS. 6A and 6B.

After the state of FIGS. 10A and 10B, the photo hole burning memory of FIG. 1 is biased similarly to FIG. 7A in the state of FIGS. 11A and 11B, and the optical beam 24A is turned on in this alternative writing mode in place of the optical beam 24B.

As the optical beam 24A, impinging parallel to the apertures 18, does not interact with the periodic structure formed by the apertures 18, the optical beam 24A penetrates into the layered structure of FIG. 1 and reaches the quantum dot layer 16. Thus, by adjusting the bias such that the distribution profile f(E) of the energy of the quantum dots 16D overlaps with the optical energy of the optical beam 24A, it is possible to cause an excitation of the electron 24 and the hole 25 as indicated in FIG. 11A. The electron 24 thus excited then reaches the quantum well layer 12 after tunneling through the barrier layers 15 and 13 consecutively as well as passing through the quantum well layer 14 intervening between the quantum dot layer 16 and the quantum well layer 12.

As a result of the writing of the information, it will be noted that a hole burning dip appears in the state distribution profile f(E) of the photonic band diagram of FIG. 11B in correspondence to the quantum dot 16D in which the optical excitation of the carriers has occurred.

In the writing mode of the present modification, therefore, it is not necessary that the optical energy of the optical beam used for writing coincides with the photonic dopant level $E_D$.

Figure 12A:
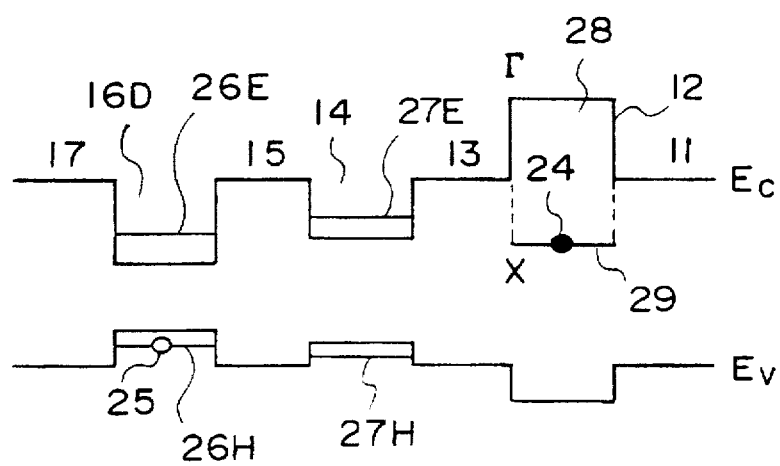
FIGS. 12A and 12B are respectively a band diagram and a photonic band diagram showing a state after the second write mode operation of the photo hole burning memory of FIG. 2.
Figure 12B:
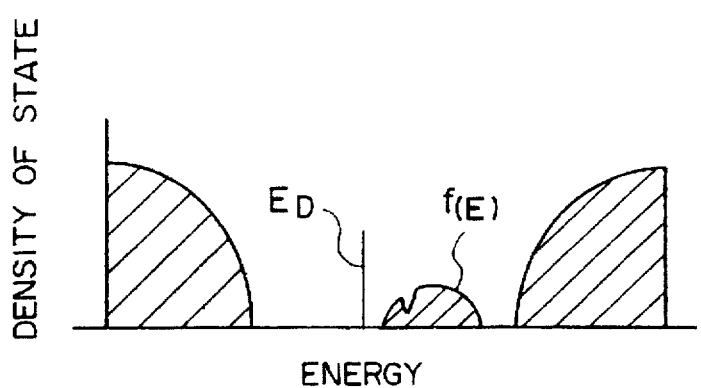

After the writing of the information, the bias is eliminated, and the photo hole burning memory holds the written information in the hold mode of FIGS. 12A and 12B that are identical to the state of FIGS. 9A and 9B. Thereby, the written information is held stably for a prolonged duration.

Hereinafter, the reason the photo hole burning memory of FIG. 1 can hold the written information stably for a prolonged duration will be explained.

In the case the photo hole burning memory of FIG. 2 has a three-dimensional periodic structure as in the structure of FIG. 4C, the periodic structure shows a photonic bandgap for the optical radiation propagating in all the directions. This also means that existence of optical radiation having an optical energy falling in the photonic bandgap is forbidden in the periodic structure for all the propagating directions of the optical radiation. Thus, as long as the photonic dopant level $E_D$ is offset from the energy distribution profile f(E) of the quantum dot 16D, the electron 24 is prohibited to cause a recombination with the hole 25 by emitting a photon even when the electron 24 has accidentally returned to the quantum dot 16D.

In the case where the photo hole burning memory has a one- or two-dimensional periodic structure, there is a direction in which a photon having an energy within the photonic bandgap can be emitted. Thus, the chance of loss of the information becomes larger in the case of the photo hole burning memory having such one-or two-dimensional periodic structure. Even in such a case, however, the duration in which the information is held stably in the device is improved substantially over the conventional photo hole burning device that lacks a periodic structure at all.

WAVELENGTH MULTIPLEX WRITING

The photo hole burning memory of FIG. 2 can be operated also in a wavelength multiplex recording mode for increasing the recording density.

When writing information by an optical beam on an optical recording medium including the photo hole burning memory of FIG. 2, the smallest recording area or elemental recording area has a size of about 1 μm in view of the diffraction of the optical beam. In conventional optical recording media such as compact disc, one bit of information is recorded in each of such elemental recording areas.

In the case of the photo hole burning memory of FIG. 2, on the other hand, a number of quantum dots 4D having respective, different energies E can exist in a single elemental recording area as represented by the distribution profile f(E) in the photonic band diagram. Thus, by changing the energy of the optical beam, it is possible, in the photo hole burning memory of FIG. 2, to write a plurality of information bits in a single elemental recording area.

Hereinafter, such a wavelength multiplex writing of information as applied to the photo hole burning memory of FIG. 2 will be described with reference to FIGS. 13A and 13B, 14A and 14B, 15A and 15B, and 16A and 16B for the case in which the optical beam 23B is used for conducting the wavelength multiplex writing of the information.

Figure 13A:
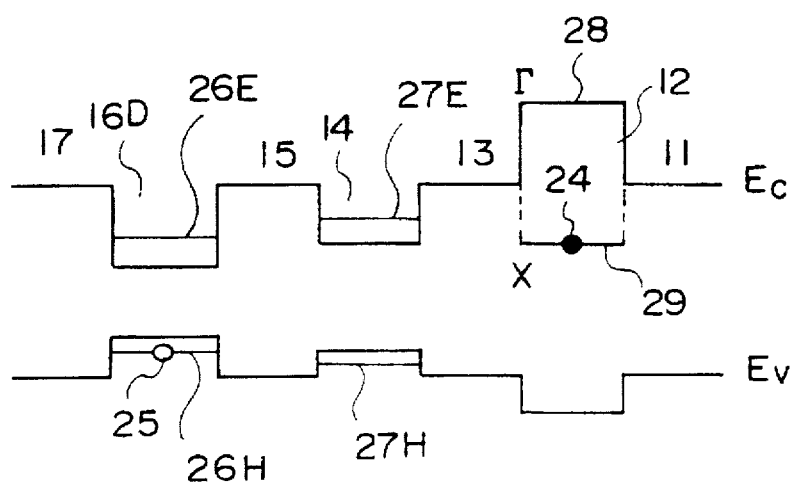
FIGS. 13A and 13B are respectively a band diagram and a photonic band diagram showing a state before a first wavelength multiplex writing mode operation of the photo hole burning memory of FIG. 2.
Figure 13B:
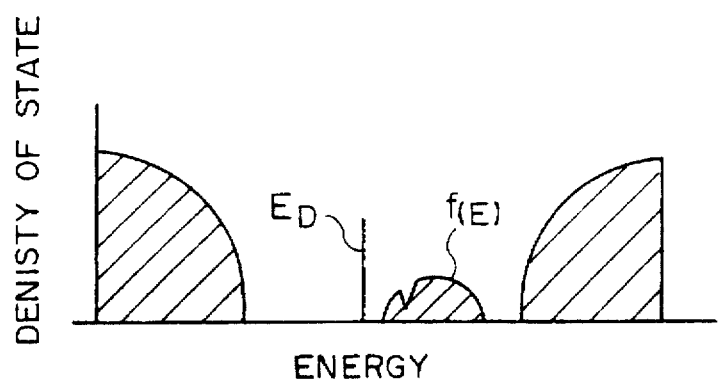

The wavelength multiplex writing of information starts with the state of FIGS. 13A and 13B in which there is a quantum well 16D already experienced optical excitation as indicated in FIG. 13A by a hole 25 at the quantum level 26H. In correspondence to this, the electron 24 is held in the quantum well layer 12. Thus, a hole-burning dip appears in the distribution f(E) of the quantum dots 16D indicating that the available state is depleted as indicated in the photonic band diagram of FIG. 13B at the dip.

On the other hand, FIG. 13B indicates also that there are other quantum dots 16D in the same elemental recording area where no information is written yet.

Figure 14A:
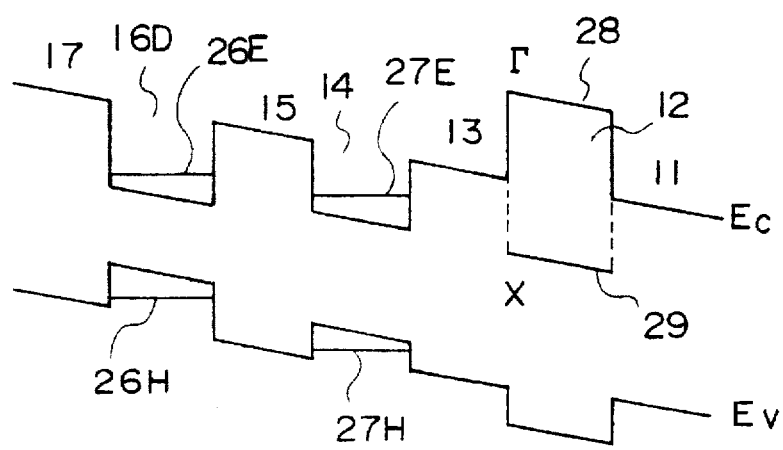
FIGS. 14A and 14B are respectively a band diagram and a photonic band diagram showing a biasing used in the first wavelength multiplex writing mode operation of the photo hole burning memory of FIG. 2.
Figure 14B:
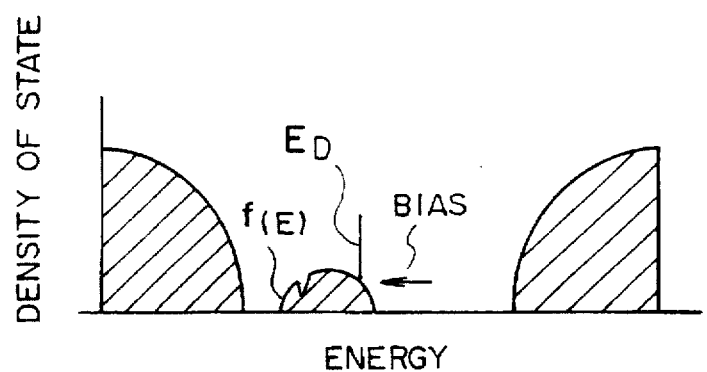

Thus, in the step of FIGS. 14A and 14B, the photo hole burning memory is biased such that the photonic dopant level $E_D$ coincides to the energy of the quantum dot 16D in which no optical excitation has occurred yet.

Figure 15A:
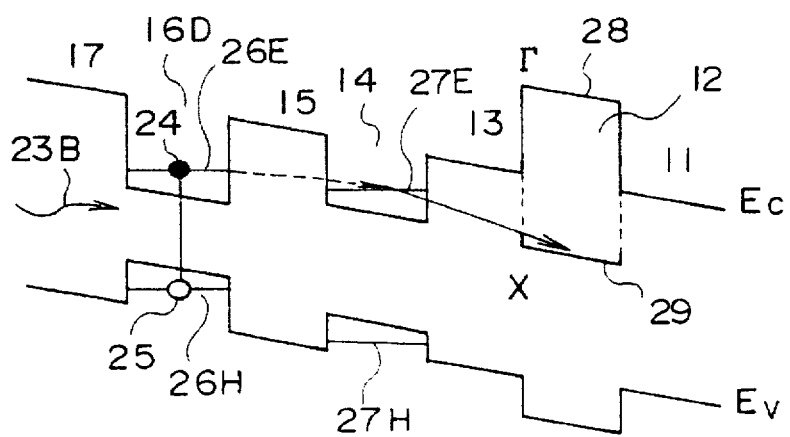
FIGS. 15A and 15B are respectively a band diagram and a photonic band diagram showing a writing of information carried out according to the first wavelength multiplex writing mode operation of the photo hole burning memory of FIG. 2.
Figure 15B:
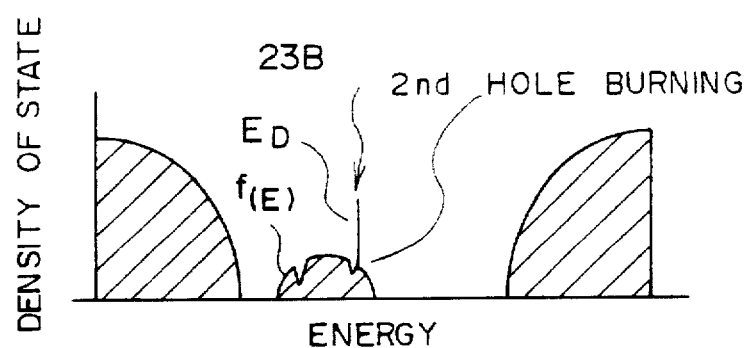
Figure 16A:
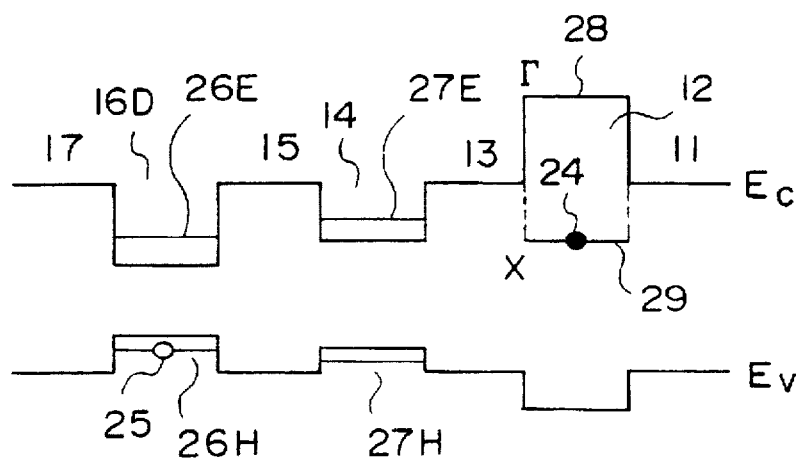
FIGS. 16A and 16B are respectively a band diagram and a photonic band diagram showing a state after the first wavelength multiplex writing mode operation of the photo hole burning memory of FIG. 2.
Figure 16B:
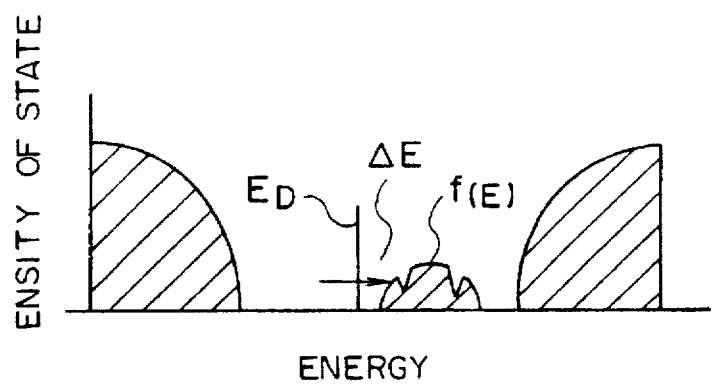

Further, the optical beam 23B is turned on as indicated in FIGS. 15A and 15B in the biased state of FIGS. 16A and 16B. Thereby, an electron hole pair formed of an electron 24 and a hole 25 is excited as indicated in FIG. 15A, and the electron 24 thus excited cause a tunneling to the quantum well layer 12 under the electric field induced as a result of the biasing, similarly to the case of FIG. 8A. In correspondence to this, it will be noted that another hole-burning dip appears in the state distribution profile f(E) of the quantum dots 16D as indicated in the photonic band diagram of FIG. 15B.

After the writing of the information as such, the biasing of the photo hole burning memory is removed in the state of FIGS. 16A and 16B. Thereby, the information, represented in FIG. 16B by the first and second dips in the state distribution profile f(E) of the quantum dots 16D, is held stably similarly to the case explained before.

In the foregoing wavelength multiplex writing, it is possible to carry out third writing, fourth writing, and so on, by changing the biasing. Thereby, there appear a third hole burning, a fourth hole burning, and so forth, in the photonic band diagram.

Figure 17A:
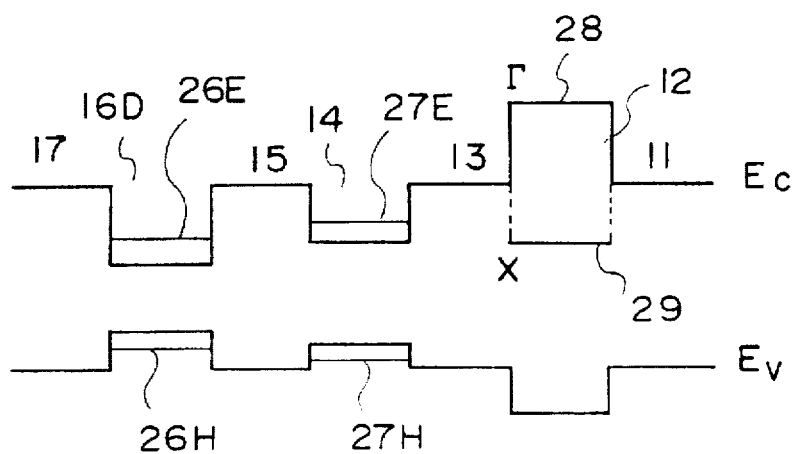
FIGS. 17A and 17B are respectively a band diagram and a photonic band diagram showing a state before a second, alternative wavelength multiplex writing mode operation of the photo hole burning memory of FIG. 2.
Figure 17B:
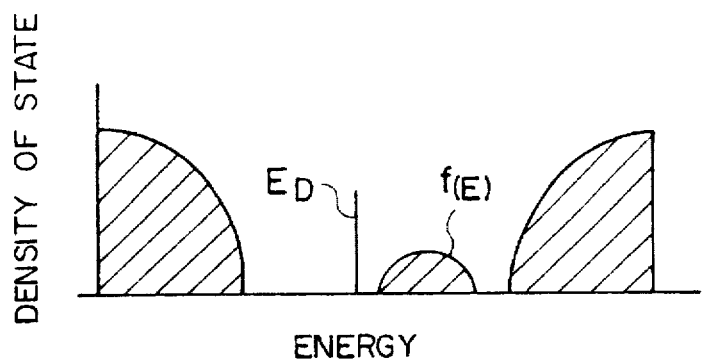

FIGS. 17A and 17B represent the case of carrying out a wavelength multiplex writing by using the optical beam 23A in place of the optical beam 23B, wherein FIGS. 17A and 17B show the state before starting a wavelength multiplex writing. The state of FIGS. 17A and 17B is substantially identical to the state of FIGS. 6A and 6B.

Figure 18A:
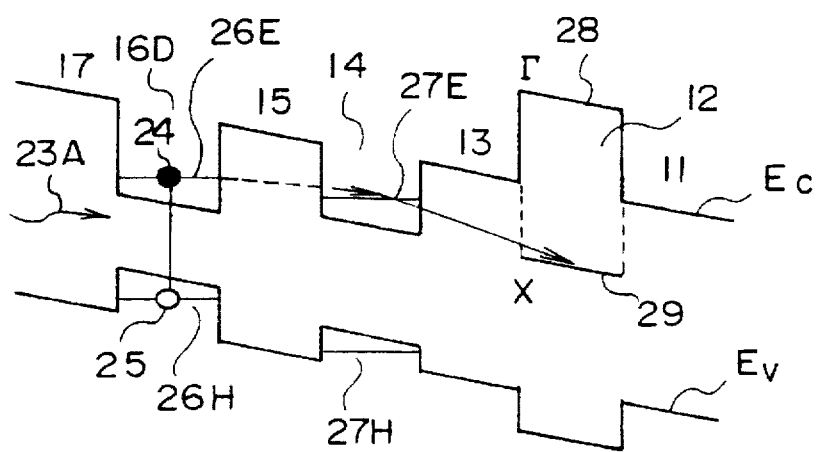
FIGS. 18A and 18B are respectively a band diagram and a photonic band diagram showing a writing of information carried out under a biasing according to the second wavelength multiplex writing mode operation of the photo hole burning memory of FIG. 2.
Figure 18B:
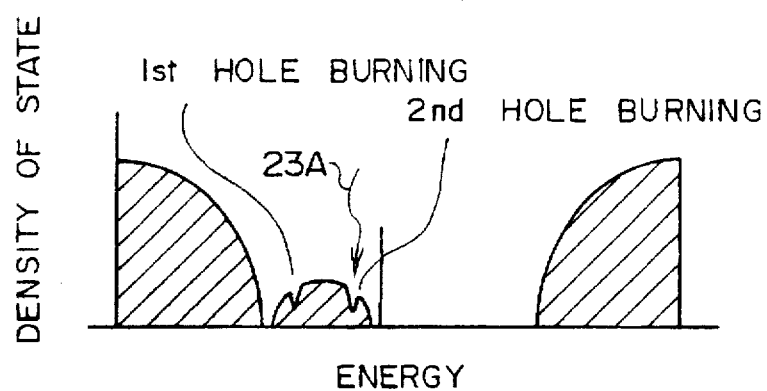

Next, in the step of FIGS. 18A and 18B, the photo hole burning memory is applied with a biasing similarly to the case of FIGS. 11A and 11B, and the optical beam 23A is applied. In response to this, there occurs an excitation of an electron-hole pair as indicated in FIG. 18A, and a writing of information is achieved as represented by a first hole burning dip in the photonic band diagram of FIG. 18B, similarly to the case of FIGS. 11A and 11B.

In the case of the present wavelength multiplex writing mode, the biasing is changed further after the foregoing first writing of the information, and a second writing is conducted by the optical beam 23A at the second bias condition. Thereby, a second hole burning dip is formed as indicated in FIG. 18B. Further, by variously changing the biasing, it is possible to carry out third, fourth writings and so forth, into various quantum dots 16D included in the elemental recording area.

Figure 19A:
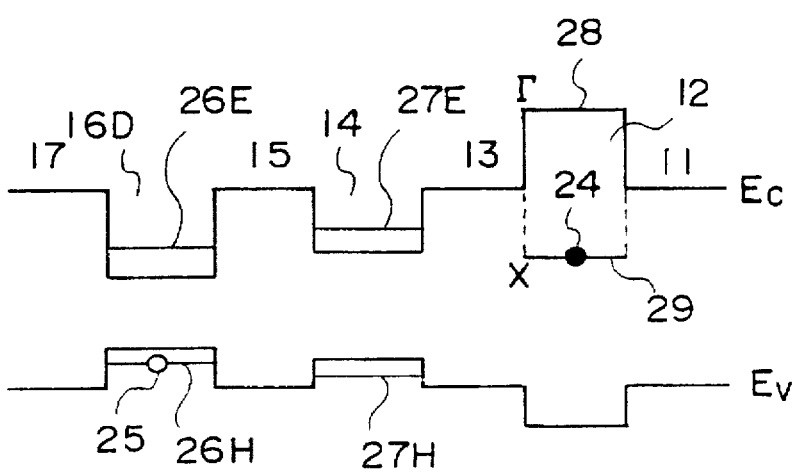
FIGS. 19A and 19B are respectively a band diagram and a photonic band diagram showing a state after the second wavelength multiplex writing mode operation of the photo hole burning memory of FIG. 2.
Figure 19B:
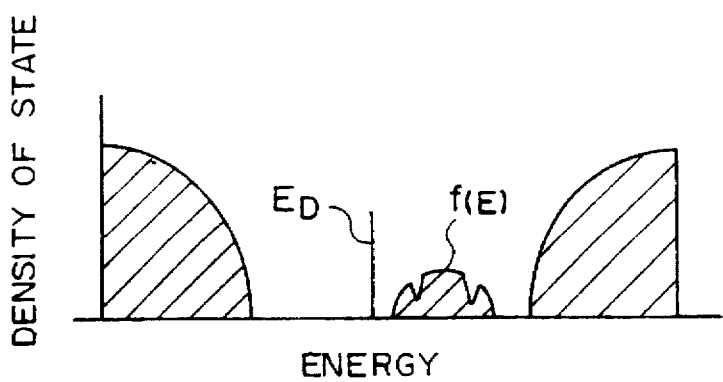

After the wavelength multiplex writing of the information as such, the biasing is removed, and the information is held stably as indicated in FIGS. 19A and 19B.

READ MODE OPERATION

Next, a reading mode operation of the photo hole burning memory of FIG. 1 will be made with reference to FIGS. 20A and 20B, 21A and 21B, 22A and 22B, and 23A and 23B.

Figure 20A:
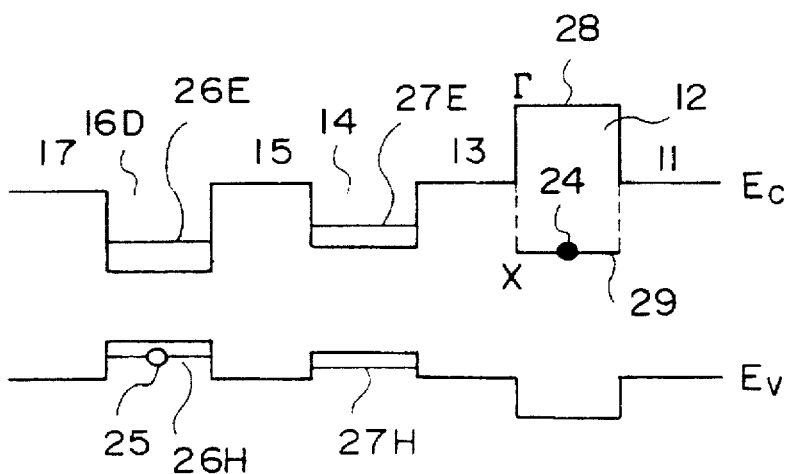
FIGS. 20A and 20B are respectively a band diagram and a photonic band diagram showing a state before a first read mode operation of the photo hole burning memory of FIG. 2.
Figure 20B:
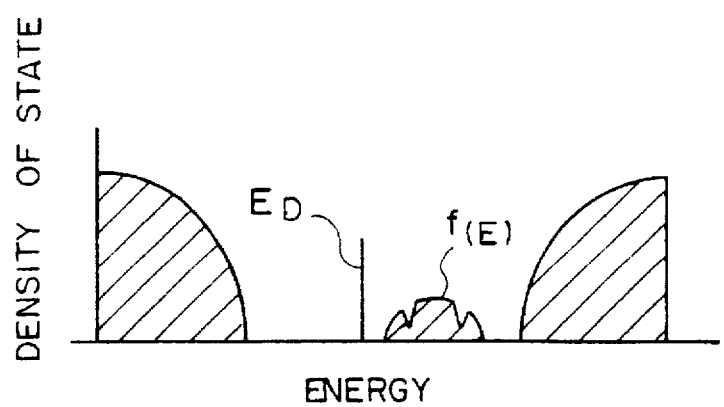
Figure 21A:
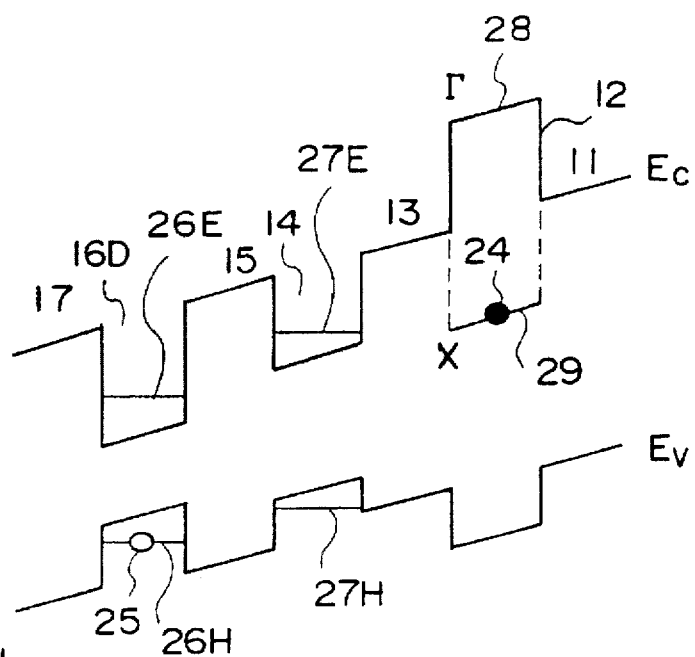
FIGS. 21A and 21B are respectively a band diagram and a photonic band diagram showing a biasing used in the first read mode operation of the photo hole burning memory of FIG. 2.

Starting with the state of FIGS. 20A and 20B showing the hold mode of the memory device similarly to the state of FIGS. 9A and 9B or 12A and 12B, a bias is applied to the photo hole burning memory of FIG. 2 as indicated in FIG. 21A, such that the photonic dopant level $E_D$ coincides to a hole burning dip corresponding to the quantum dot 16D from which the reading of information is to be made. See the photonic band diagram of FIG. 21B. As will be noted in FIG. 21A, the biasing applied to the photo hole burning memory in the reading mode operation is opposite to the biasing used in the writing mode explained heretofore.

Figure 21B:
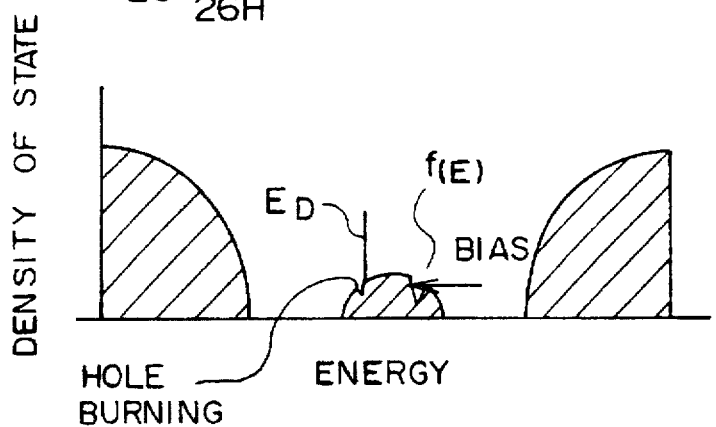
Figure 22A:
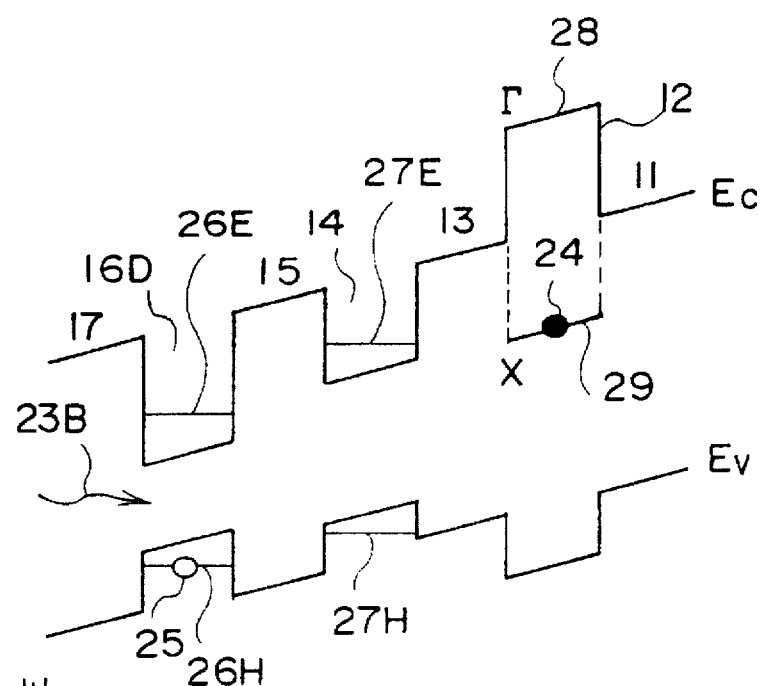
FIGS. 22A and 22B are respectively a band diagram and a photonic band diagram showing a reading of information according to the first read mode operation of the photo hole burning memory of FIG. 2.
Figure 22B:
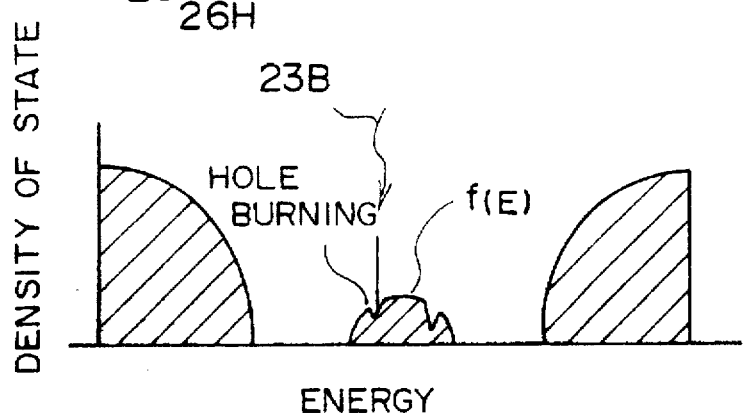

Next, in the step of FIGS. 22A and 22B, the optical beam 23B is turned on in the tuned state of FIG. 21B, wherein the optical beam 23B has an energy coincident to the photonic dopant level $E_D$ and hence coincident to the hole burning dip. Thereby, the quantum dot 16D corresponding to the hole burning dip cannot absorb the optical beam 23B and the optical beam passes through the quantum dot 16D unabsorbed. In other words, the quantum dot 16D is transparent to the optical beam 23B.

On the other hand, when the quantum dot 16D does not form a hole burning dip in correspondence to the absence of optical excitation in the write mode operation, the optical beam 23B is absorbed by causing an excitation of an electron-hole pair. In other words, the quantum dot 16D is opaque to the optical beam 23B. Thus, by detecting the passage of the optical beam 23B by the photodetector 21, it is possible to discriminate whether the information written into the quantum dot 16D is "1" or "0."

It should be noted that the optical excitation of the electron-hole pair in the read mode operation does not modify the content of the written information, as the electron excited by the optical beam 23B in the read mode operation returns immediately to the quantum dot 16D under the biasing that is opposite to the biasing used at the time of write mode operation when the optical excitation is interrupted. The electron thus returned to the quantum dot 16D is annihilated therein by causing a recombination with the hole.

Figure 23A:
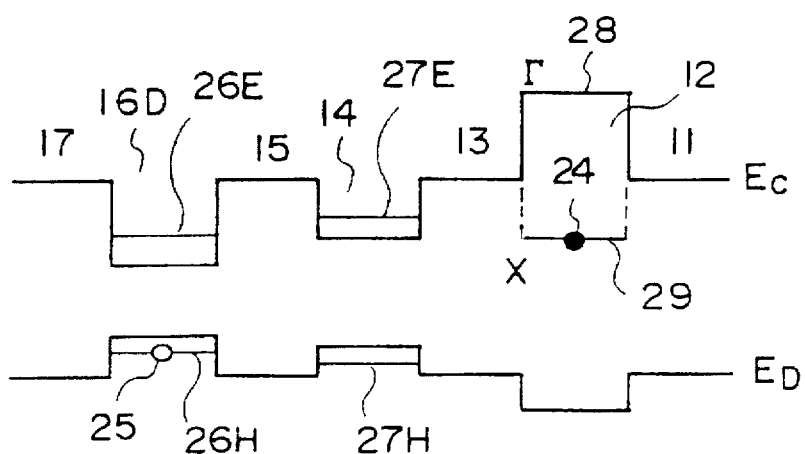
FIGS. 23A and 23B are respectively a band diagram and a photonic band diagram showing a state after the first read mode operation of the photo hole burning memory of FIG. 2.
Figure 23B:
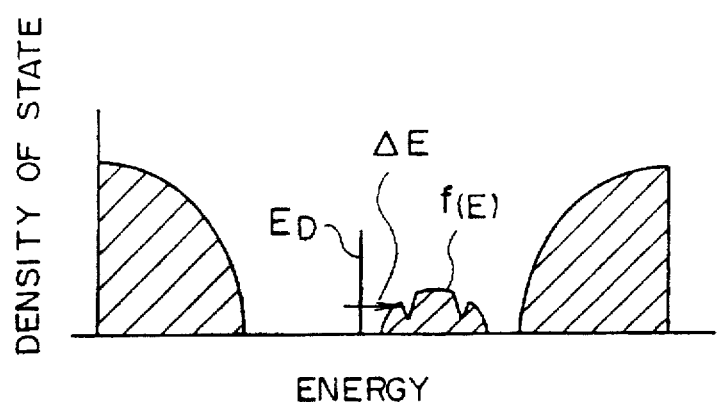
Figure 24A:
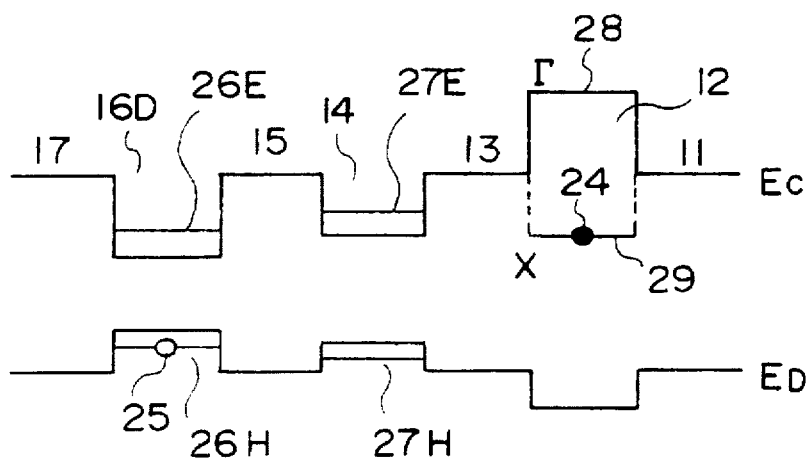
FIGS. 24A and 24B are respectively a band diagram and a photonic band diagram showing a state before a second, alternative read mode operation of the photo hole burning memory of FIG. 2.
Figure 24B:
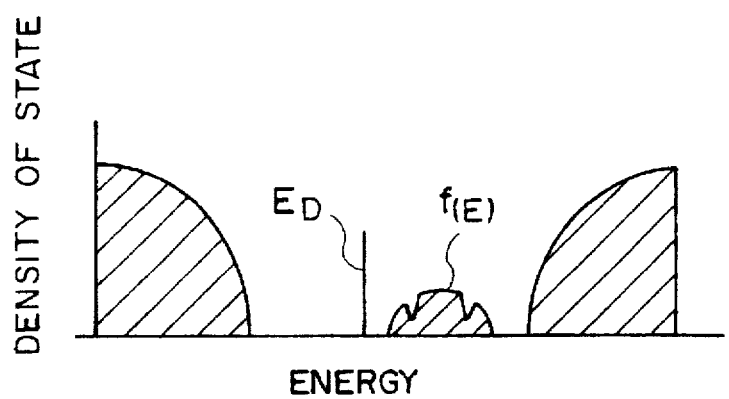

After the foregoing reading of the information, the biasing of the photo hole burning memory device is removed, and the device returns to the hold mode as indicated in FIGS. 23A and 23B that is substantially identical to the hold mode of FIGS. 9A and 9B or 12A and 12B. It should be noted that is no modification in the written information.

The reading of information can be made also by using the optical beam 23A that is directed perpendicularly to the layered structure of FIG. 2 and hence parallel to the apertures 18.

In this operational mode, the wavelength of the optical beam 23A is tuned to the energy of the quantum dot 16D from which the reading of the information is to be made, by using a tunable laser diode as the optical source of the optical beam 23A. Thereby, when there is a hole burning dip in correspondence to the quantum dot 16D, the optical beam 23A passes through the quantum dot 16D unabsorbed. On the other hand, when there is no hole burning dip in the quantum dot 16D, the optical beam is absorbed by causing an excitation of an electron-hole pair. Thereby, by detecting the passage of the optical beam 23A by the photodetector 21, it is possible to discriminate whether the written information is "1" or "0." As there is no write mode biasing as in the case of the write mode operation in the foregoing read mode operation of the photo hole burning memory, the electron thus excited remains in the quantum dot 16D and is not transported to the quantum well layer 12. Thereby, the problem of modification of the written information at the time of reading is avoided.

Figure 25A:
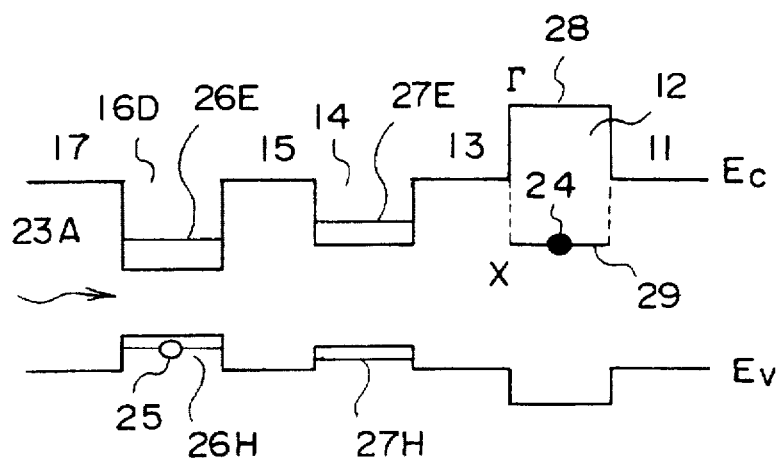
FIGS. 25A and 25B are respectively a band diagram and a photonic band diagram showing a reading of information according to the second read mode operation of the photo hole burning memory of FIG. 2.
Figure 25B:
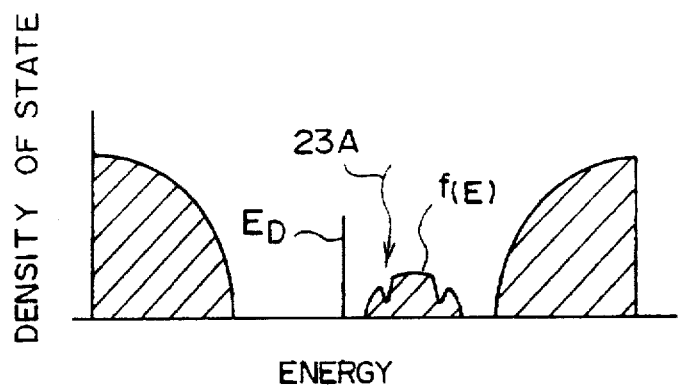
Figure 26A:
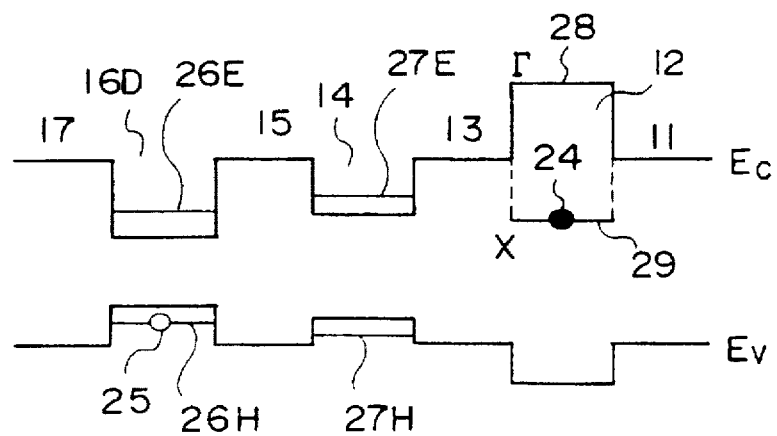
FIGS. 26A and 26B are respectively a band diagram and a photonic band diagram showing a state after the second read mode operation of the photo hole burning memory of FIG. 2.
Figure 26B:
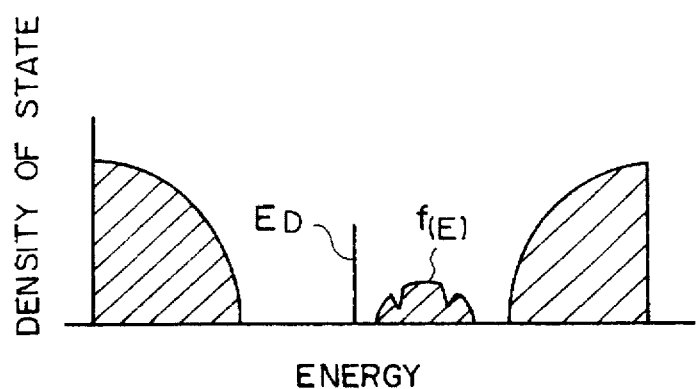

After the step of FIGS. 25A and 25B, the read mode biasing is removed and the device returns to the hold mode operation as indicated in FIGS. 26A and 26B. Thereby, it sill be noted that the modification of the written information is avoided.

In the foregoing read mode operation that uses the optical beam 23A, one may use the read mode biasing similar to the one shown in FIG. 22A for achieving a tuning of the optical beam 23A with respect to the quantum dot 16D while simultaneously avoiding the modification of the written information.

ERASE MODE OPERATION

Next, an erasing mode operation will be described for the photo hole burning memory of FIG. 1 with reference to FIGS. 27A and 27B, 28A and 28B, 29A and 29B, and 30A and 30B.

Figure 27A:
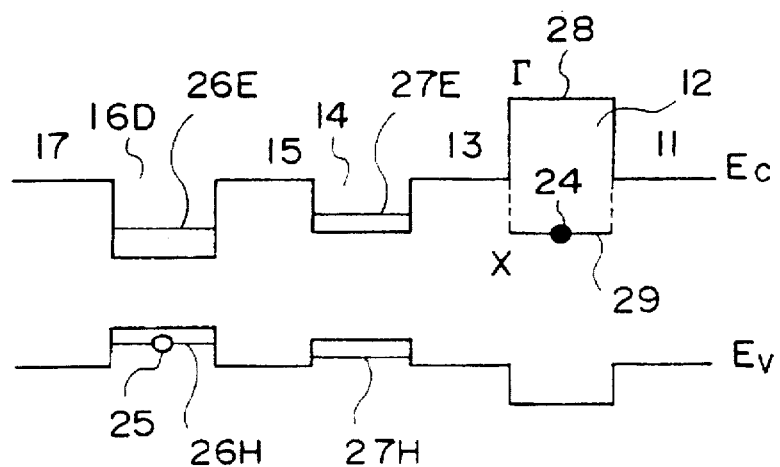
FIGS. 27A and 27B are respectively a band diagram and a photonic band diagram showing a state before an erase mode operation of the photo hole burning memory of FIG. 2.
Figure 27B:
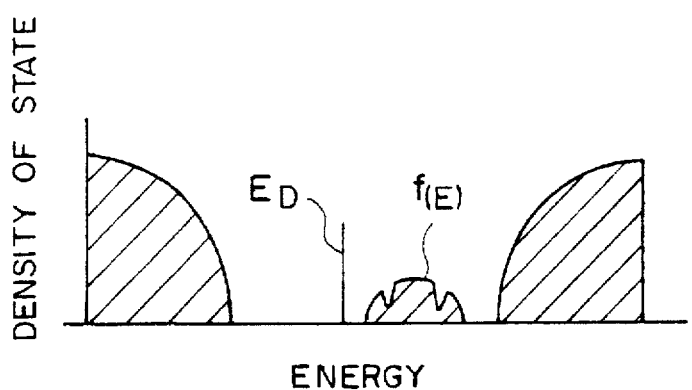
Figure 28A:
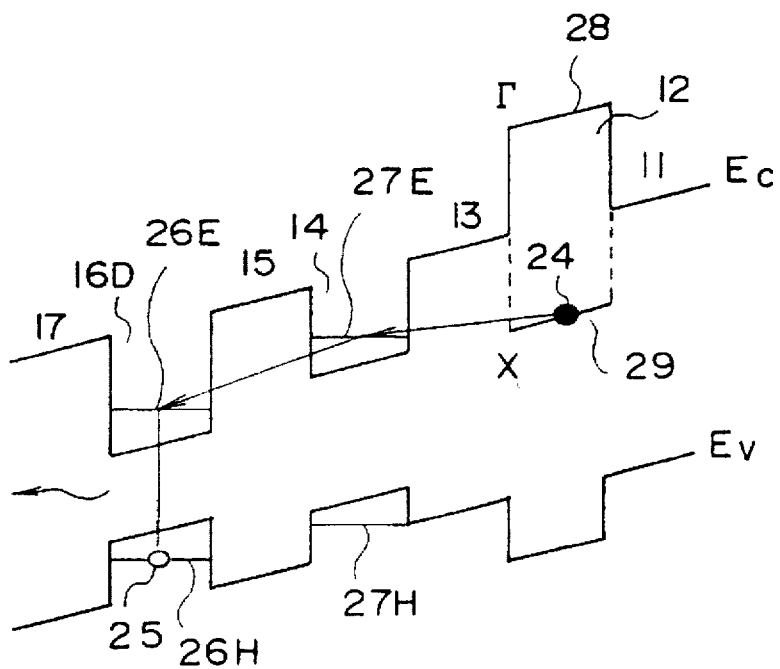
FIGS. 28A and 28B are respectively a band diagram and a photonic band diagram showing a biasing used in the erase mode operation of the photo hole burning memory of FIG. 2.
Figure 28B:
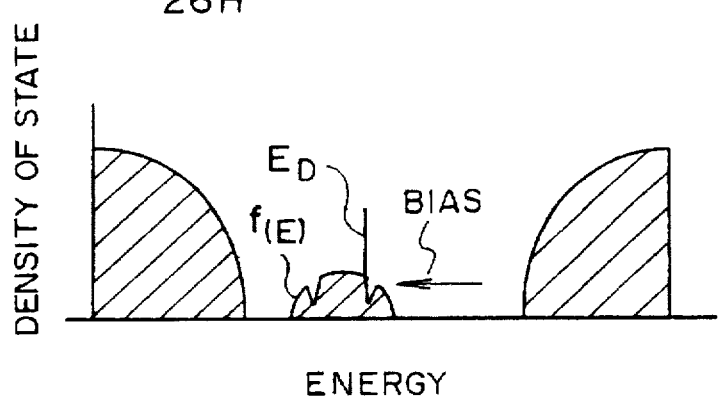

Starting from the state of FIGS. 27A and 27B corresponding to the hold mode operation explained already, the photo hole burning memory of FIG. 2 is applied with a biasing similar to the one used when reading the information such that the energy of the quantum dot 16D from which the information is erased coincides with the photonic dopant level $E_D$. Thereby, the electron 24 held in the quantum well 29 in the quantum well layer 12 causes a tunneling back to the quantum dot 16D after passing through the quantum layer 14, wherein the electron 24 thus returned causes a recombination with the hole 25 in the quantum dot 16D, by emitting a photon having an energy coincident to the energy of the photonic dopant level $E_D$ as indicated in FIGS. 29A and 29B.

Figure 29A:
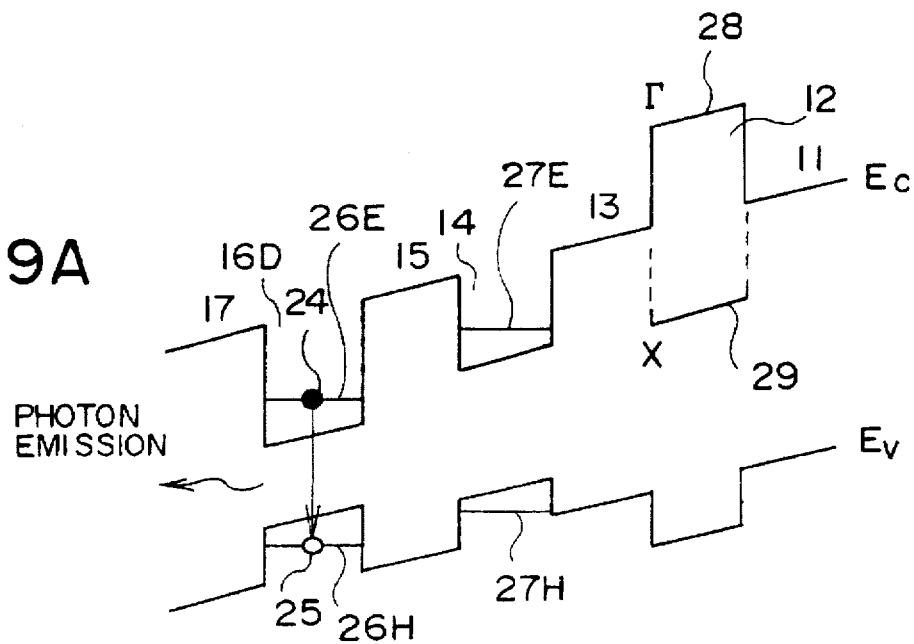
FIGS. 29A and 29B are respectively a band diagram and a photonic band diagram showing an erasing of information according to the erase mode operation of the photo hole burning memory of FIG. 2.
Figure 29B:
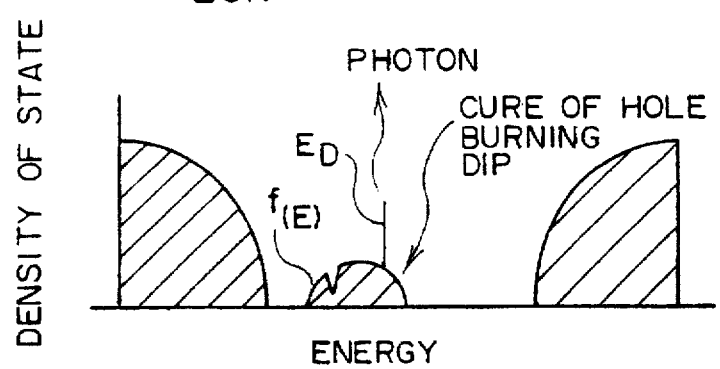
Figure 30A:
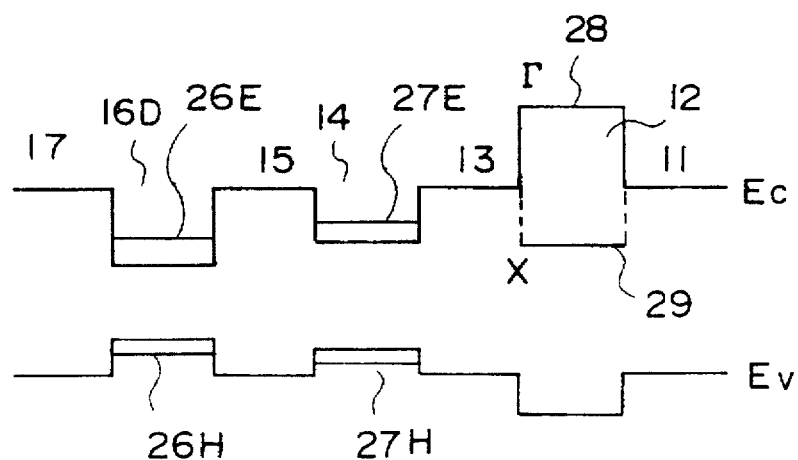
FIGS. 30A and 30B are respectively a band diagram and a photonic band diagram showing a state after the erase mode operation of the photo hole burning memory of FIG. 2.
Figure 30B:
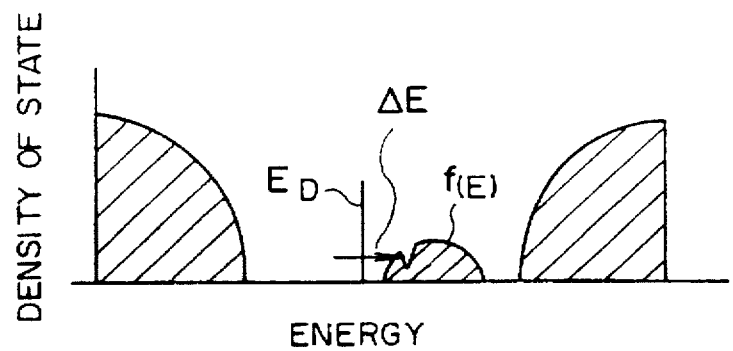

After the step of FIGS. 29A and 29B, the bias is removed as indicated in FIGS. 30A and 30B, wherein it will be noted that the hole burning dip corresponding to the selected quantum dot 16D is successfully cured as a result of the foregoing erasing operation.

In the case of the device having a three dimensional periodic structure such as the one shown in FIG. 4C, it is essential to tune the energy of the quantum dot 16D to the photonic dopant level $E_D$ in order to conduct an erasing of information, while in the case of the device having a one-dimensional or two-dimensional periodic structure, it is possible to increase the rate of erasing by tuning the energy of the quantum dot 16D to the photonic dopant level $E_D$.

In any of the foregoing write mode operation, read mode operation and erase mode operation, it should be noted that the writing, reading and erasing of information occur in each elemental recording area defined in the structure as a region where an upper electrode 19 and a lower electrode 20 intersect with each other when viewed perpendicularly to the layered structure of FIG. 1. The electrodes 19 and 20 are formed of electrode stripes of $InSnO_3$ each having a width of 100 nm and a thickness of 100 nm.

As already noted, such an elemental recording area includes a number of quantum dots 16D having respective energies, and because of this, there appears a distribution of states for the quantum dots 16D as indicated by the distribution profile f(E).

[SECOND EMBODIMENT]

Figure 31:
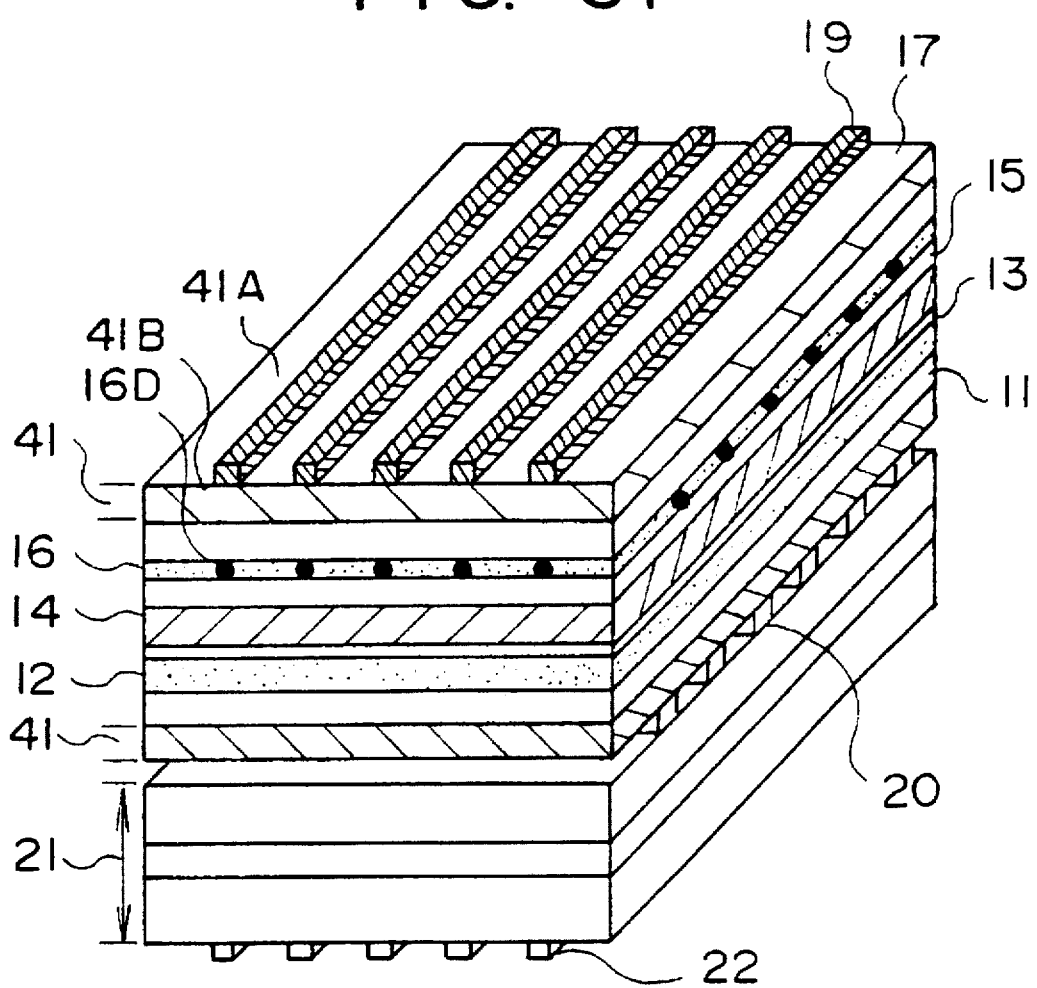
FIG. 31 is a diagram showing the construction of a photo hole burning memory according to a second embodiment of the present invention.

FIG. 31 shows a photo hole burning memory according to a second embodiment of the present invention, wherein those parts corresponding to the parts described already are designated by the same reference numerals and the description thereof will be omitted.

Referring to FIG. 31, the photo hole burning memory of the present embodiment includes a multi-layered mirror 41 above the barrier layer 17 and below the barrier layer 11 to form an optical cavity, wherein the multi-layered mirror 41 includes an alternate stacking of a first film 41A and a second film 41B. In the illustrated example, the film 41A has a composition of $Al_{0.3}Ga_{0.7}As$ and a thickness of 200 nm, while the film 41B has a composition of AlAs and a thickness of 200 nm. The films 41A and 41B are repeated ten times in each of the mirrors 41, wherein the upper mirror 41 and the lower mirror 41 are separated from each other with a distance of about 0.8 μm.

By forming the multi-layered mirrors 41 as indicated in FIG. 31, the photo hole burning memory of the present embodiment shows a one-dimensional periodic structure that forms a photonic bandgap interacting with an optical beam incident perpendicularly to the layered structure of FIG. 31.

[THIRD EMBODIMENT]

FIG. 32 shows a photo hole burning memory according to a third embodiment of the present invention, wherein those parts described previously are designated by the same reference numerals and the description thereof will be omitted.

In the present embodiment, the structure of FIG. 1 and the structure of FIG. 31 are combined to form a three-dimensional periodic structure. Thereby, the three-dimensional periodic structure forms a three-dimensional photonic bandgap that interacts with an optical beam incoming from any directions. The photo hole burning memory of the present embodiment provides a superior retention of the written information by effectively suppressing the recombination of the excited electron and hole in the quantum dot.

[FOURTH EMBODIMENT]

Figure 33:
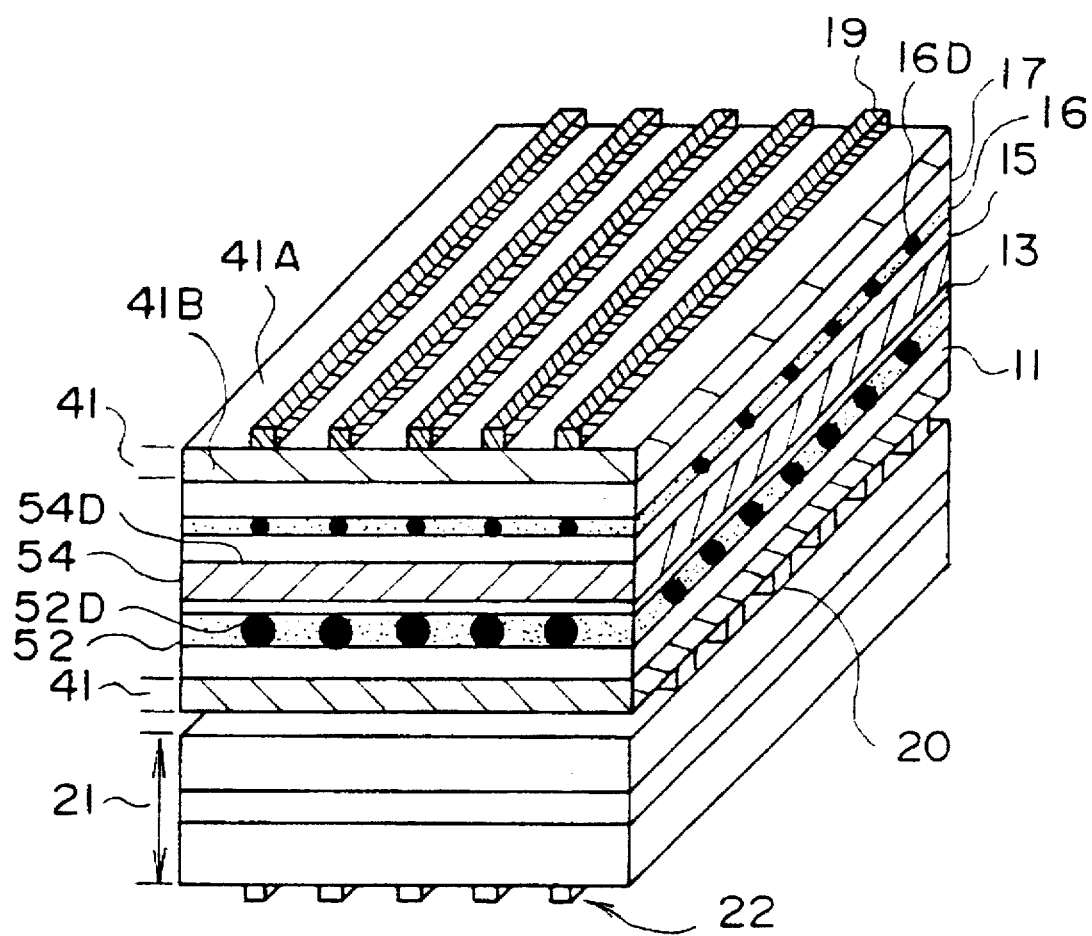
FIG. 33 is a diagram showing the construction of a photo hole burning memory according to a fourth embodiment of the present invention.

FIG. 33 shows a photo hole burning memory according to a fourth embodiment of the present invention, wherein those parts described previously are designated by the same reference numerals and the description thereof will be omitted.

In the embodiment of FIG. 33, the type II quantum well layer 12 is replaced by a quantum dot layer 52 including therein quantum dots 52D of type II. Further, the type I quantum well layer 14 is replaced by a quantum dot layer 54 including therein quantum dots 54D of type I.

Typically, the quantum dot layer 52 is formed of AlGaAs having a thickness of about 7 nm and a composition of $Al_{0.5}Ga_{0.5}As$ while the quantum dots 52D is formed of AlAs and has a size of about 7 nm. The quantum dot layer 54, on the other hand, is formed of AlGaAs having a thickness of about 5 nm and a composition of $Al_{0.5}Ga_{0.5}As$ while the quantum dots 54D is formed of AlGaAs having a composition of $Al_{0.3}Ga_{0.7}As$ and has a size of about 5 nm.

By forming the quantum dots 52D and 54D under the quantum dots 16D, it is possible to cause the transfer of the excited electron from a quantum dot 16D in which the excitation has occurred to a corresponding quantum dot 52D located immediately underneath the foregoing quantum dot 16D via a corresponding quantum dot 54D. Thereby, the electron thus held in the quantum dot 52D returns immediately to the original quantum dot 16D at the time of erase mode operation. In other words, one can accelerate the speed of erasing of information in the construction of FIG. 33.

The quantum dots 52D and 54D may be formed similarly to the process described with reference to FIGS. 3A–3E. Alternatively, the quantum dots 54D may be formed in the form of isolated island embedded in a barrier layer of AlGaAs.

In the photo hole burning memory of FIG. 33, it is possible to provide a three-dimensional periodic structure similarly to the structure of FIG. 32.

[FIFTH EMBODIMENT]

Figure 34:
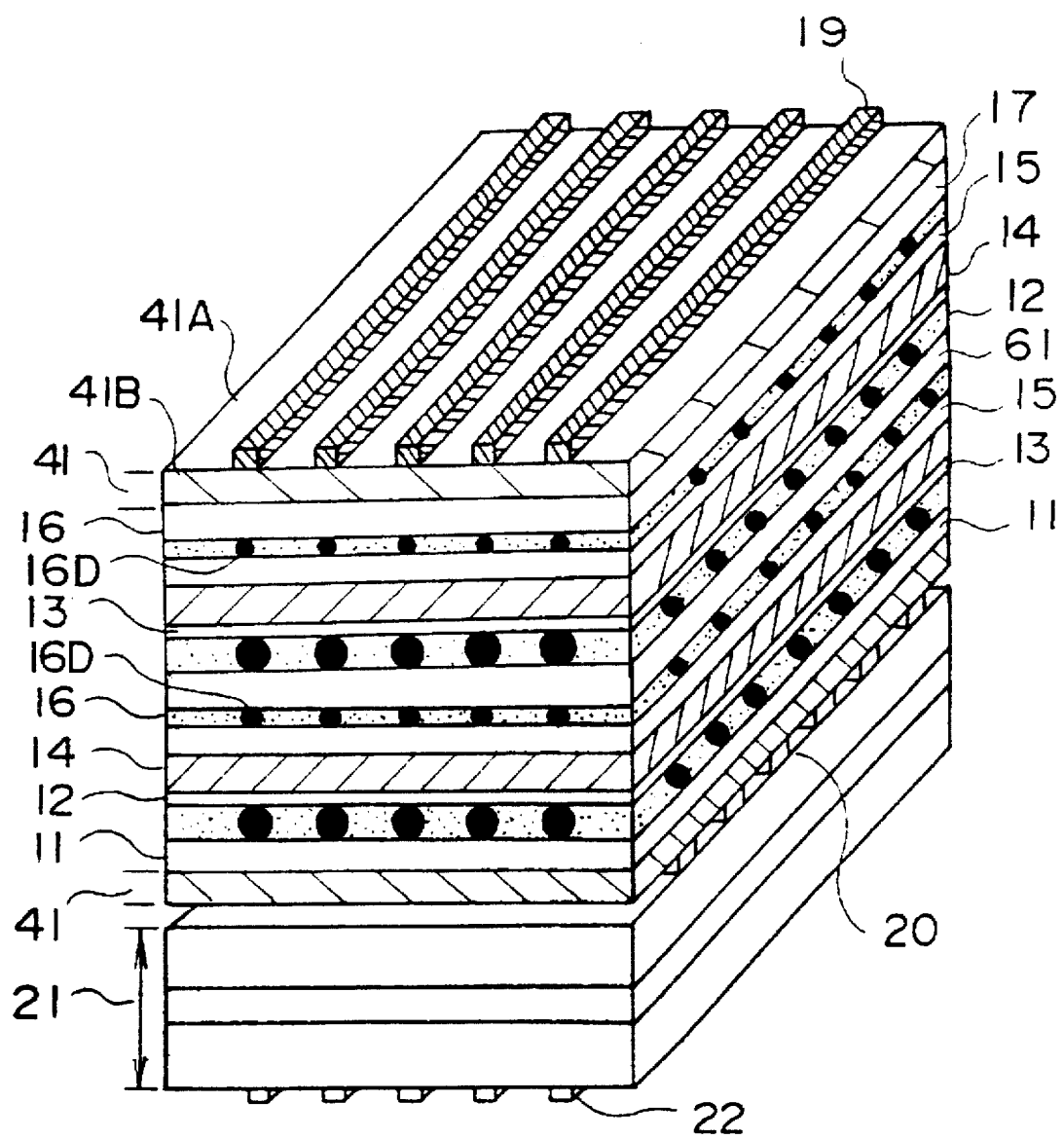
FIG. 34 is a diagram showing the construction of a photo hole burning memory according to a fifth embodiment of the present invention.

FIG. 34 shows a photo hole burning memory according to a fifth embodiment of the present invention, wherein those parts described previously are designated by the same reference numerals and the description thereof will be omitted.

Referring to FIG. 34, it will be noted that the structure of FIG. 34 includes the layers 12–16 repeated twice in the structure of FIG. 31 with an intervening barrier layer 61 of AlGaAs interposed between an upper layered structure including the stacking of the layers 12–16 and a lower layered structure including also the stacking of the layers 12–16. By repeating the quantum dot layers 16 as well as the quantum well layers 12 and 14 as such, it is possible to increase the optical absorption at the time of reading mode operation of the memory device. In other words, the S/N ratio is improved at the time of reading.

Similarly as before, it is possible and also preferable to form a three-dimensional periodic structure for creating the photonic bandgap in the embodiment of the present invention.

SIXTH EMBODIMENT

Figure 35:
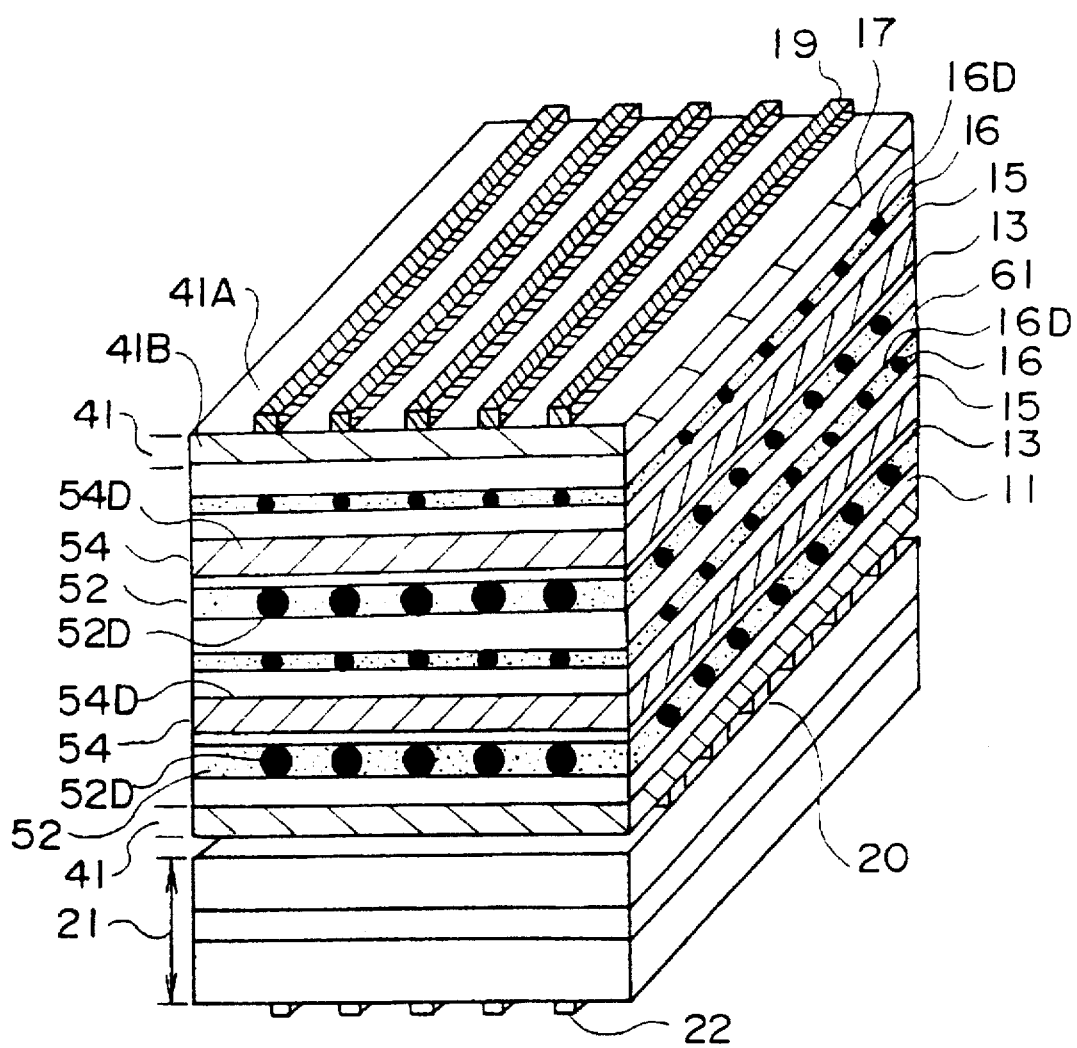
FIG. 35 is a diagram showing the construction of a photo hole burning memory according to a sixth embodiment of the present invention.

FIG. 35 shows a photo hole burning memory according to a sixth embodiment of the present invention, wherein those parts described previously are designated by the same reference numerals and the description thereof will be omitted.

In the embodiment of FIG. 35, the structure of FIG. 33 is repeated similarly to the case of FIG. 34, in which the barrier layer 61 is interposed between the lower layered structure and the upper layered structure, wherein each of the upper and lower layered structures includes a stacking of layers 11, 52, 13, 54, 15 and 16.

In the present embodiment, too, it is possible to form a three-dimensional periodic structure for forming a photonic bandgap that maximizes the retention time of information.

Further, the present invention is not limited to the embodiments described heretofore, but various variations and modifications may be made without departing from the scope of the invention.

what is claimed is:

1. A photo hole burning memory device comprising:

a quantum dot layer including a plurality of quantum dots each forming a quantum level in said quantum dot layer, each of said quantum dots absorbing an optical radiation having an energy corresponding to said quantum level and creating an electron-hole pair in response thereto;

a periodic structure provided in said quantum dot layer for creating a photonic bandgap including therein an absorption energy of said quantum dot;

an information retention layer provided adjacent to said quantum dot layer, said information retention layer including a quantum well having a quantum level lower than said quantum level of said quantum dots;

a tunneling barrier layer interposed between said quantum dot layer and said information retention layer, said tunneling barrier layer forming a potential barrier, said tunneling barrier layer having a thickness that allows a passage of electrons therethrough by tunneling; and a biasing electrode structure for applying a biasing electric field to said quantum dot layer and said information retention layer.

2. A photo hole burning memory device as claimed in claim 1, wherein said periodic structure includes an irregularity such that said irregularity forms a level in said photonic bandgap.

3. A photo hole burning memory device as claimed in claim 1, wherein said periodic structure includes a one-dimensional periodic structure repeated one-dimensionally.

4. A photo hole burning memory device as claimed in claim 1, wherein said periodic structure includes a two-dimensional periodic structure repeated two-dimensionally.

5. A photo hole burning memory device as claimed in claim 1, wherein said periodic structure includes a three-dimensional periodic structure repeated three-dimensionally.

6. A photo hole burning memory device as claimed in claim 1, wherein said information retention layer comprises a semiconductor material causing an indirect transition of carriers.

7. A photo hole burning memory device as claimed in claim 6, wherein said information retention layer includes a $\Gamma$ valley and an X valley, said X valley having an energy level lower than an energy level of said $\Gamma$ valley, said X valley thereby forming said quantum well in said information retention layer.

8. A photo hole burning memory device as claimed in claim 1, wherein said photo hole burning memory device further includes an intermediate layer disposed between said quantum dot layer and said information retention layer, said intermediate layer including a quantum well having an energy larger than an energy of said quantum dots.

9. A photo hole burning memory device as claimed in claim 1, wherein said photo hole burning memory device further includes an intermediate layer disposed between said quantum dot layer and said information retention layer, said intermediate layer including quantum dots having an energy larger than an energy of said quantum dots.

10. A photo hole burning memory device as claimed in claim 1, wherein said electrode structure includes a plurality of first electrodes disposed on a first side of a layered semiconductor body forming said photo hole burning memory device and a plurality of second electrodes disposed on a second, opposite side of said layered semiconductor body, said layered semiconductor body including therein said quantum dot layer, said tunneling barrier layer and said information retention layer;

said quantum dot layer including therein a plurality of said quantum dots in each area where one of said first electrodes intersect with one of said second electrodes when viewed perpendicularly to said layered semiconductor body.

* * * * *